(12) United States Patent
Iida et al.

(10) Patent No.: US 8,018,272 B2
(45) Date of Patent: Sep. 13, 2011

(54) FILTER CIRCUIT AND COMMUNICATION DEVICE

(75) Inventors: Sachio Iida, Chiba (JP); Atsushi Yoshizawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/627,399

(22) Filed: Nov. 30, 2009

(65) Prior Publication Data
US 2010/0156560 A1 Jun. 24, 2010

(30) Foreign Application Priority Data
Dec. 19, 2008 (JP) .................................. 2008-324666

(51) Int. Cl.
*H03K 5/00* (2006.01)
(52) U.S. Cl. ...................... 327/554; 327/556; 327/137
(58) Field of Classification Search .......... 327/551–559, 327/336–337
See application file for complete search history.

(56) References Cited

U.S. PATENT DOCUMENTS

| | | | |
|---|---|---|---|
| 7,394,673 B2 * | 7/2008 | Oyama et al. .................... | 363/59 |
| 7,522,433 B2 * | 4/2009 | Delano et al. .................... | 363/60 |
| 2010/0080023 A1 * | 4/2010 | Jain .................................. | 363/65 |
| 2010/0156561 A1 * | 6/2010 | Iida et al. ......................... | 333/174 |
| 2010/0156564 A1 * | 6/2010 | Iida et al. ......................... | 333/181 |

FOREIGN PATENT DOCUMENTS

| | | |
|---|---|---|
| JP | 8-274587 | 10/1996 |
| JP | 2007-240299 | 9/2007 |

OTHER PUBLICATIONS

U.S. Appl. No. 12/608,535, filed Oct. 29, 2009 Iida, et al.
U.S. Appl. No. 12/614,684, filed Nov. 9, 2009 Iida et al.
S. Manetti, et al., "Switched-capacitor lowpass filter without active components," Electronics Letters, Nov. 6, 1980, vol. 16, No. 23, pp. 883-885.
Office Action issued Sep. 7, 2010 in JP Application No. 2008-324666.
S. Manetti, "Passive Switched Capacitor Filters: General Biquad Topology", Electronics Letters, vol. 20, No. 2, Jan. 19, 1984, pp. 101-102.

* cited by examiner

*Primary Examiner* — Dinh T. Le
(74) *Attorney, Agent, or Firm* — Oblon, Spivak, McClelland, Maier & Neustadt, L.L.P.

(57) ABSTRACT

There is provided a filter circuit that includes a flying capacitor and a capacitor that is provided in parallel with the flying capacitor, between an input terminal and an output terminal of the flying capacitor. As the capacitor that has a predetermined capacity is provided between the input terminal and the output terminal of the flying capacitor, it is possible to provide steep attenuation characteristics in the filter circuit provided with the flying capacitor.

11 Claims, 22 Drawing Sheets

US 8,018,272 B2

FILTER CIRCUIT AND COMMUNICATION DEVICE

BACKGROUND OF THE INVENTION

1. Field of the Invention

The present invention relates to a filter circuit and a communication device.

2. Description of the Related Art

The power supply voltage of a radio frequency (RF) circuit tends to decrease along with miniaturization of a complementary metal oxide semiconductor (CMOS) process. Due to the miniaturization of the CMOS process, if an RF circuit is mounted using a known circuit technique, a voltage margin becomes insufficient and the dynamic range of the signal amplitude is narrowed. Meanwhile, the cut-off frequency of a transistor increases due to the miniaturization of the CMOS process, which is advantageous for operations in which high-speed switching operations are performed accurately at a precise timing. In addition, it is also advantageous that the capacitor ratio becomes accurate due to highly accurate lithography.

A digital RF technology is a new technology that introduces the concept of discrete time signal processing to the RF circuit, in order to avoid the problems that may be caused as a result of the miniaturization of the CMOS process and to obtain the advantages. A charge domain filter is used as a main circuit in the digital RF technology field. The charge domain filter is a filter circuit that is formed by a transconductance amplifier, switches and capacitors. The charge domain filter performs sampling of analog signals by accumulating and discharging electric charges in synchronization with a clock, and performs filtering, decimation and the like using discrete time signal processing.

As a known example of the charge domain filter, there is a charge domain second order infinite impulse response low pass filter (IIR-LPF) such as that described in S. Manetti and A. Liberatore, "Switched-capacitor lowpass filter without active components," Electron. Lett., 1980, 16, pp. 883-885. The charge domain second order IIR-LPF is advantageous in that it can be realized by a simple charge domain circuit.

SUMMARY OF THE INVENTION

However, with the known charge domain second order IIR-LPF described in "Switched-capacitor lowpass filter without active components," attenuation characteristics are moderate in the vicinity of the cut-off frequency, and a filter having steep characteristics cannot be structured.

In light of the foregoing, it is desirable to provide a novel and improved filter circuit that is capable of having steep attenuation characteristics in a filter circuit including a flying capacitor, and a communication device provided with the filter circuit.

According to an embodiment of the present invention, there is provided a filter circuit including a flying capacitor which maintains polarity when switching from an input terminal to an output terminal, and the polarity of which is reversed when switching from the output terminal to the input terminal; and a capacitor that is provided in parallel with the flying capacitor, between the input terminal and the output terminal of the flying capacitor.

With the above-described structure, when switching from the input terminal to the output terminal, the flying capacitor maintains polarity, and when switching from the output terminal to the input terminal, the polarity is reversed. The capacitor is provided in parallel with the flying capacitor, between the input terminal and the output terminal of the flying capacitor. As a consequence, owing to the capacitor provided in parallel with the flying capacitor, it is possible to provide the filter circuit having steep attenuation characteristics.

The flying capacitor may be switched from the input terminal to the output terminal with a delay of J clocks, J being a natural number of 1 or more, of a clock cycle input to the flying capacitor after the switching from the output terminal to the input terminal, and the flying capacitor is switched from the output terminal to the input terminal with a delay of K clocks, K being a natural number of 1 or more, of the clock cycle after the switching from the input terminal to the output terminal.

A value of J may be variable. A value of J may be variable, and a sum of J and K may be constant. A value of J may be variable, and a value of K may be constant.

A plurality of groups of the flying capacitor and the capacitor may be connected in a cascade arrangement.

A capacity of the capacitor may be M times a capacity of a capacitor included in the flying capacitor, M being a value when M that is equal to $\exp(-j*2\pi f*Ts*J)/(\exp(-j*2\pi f*Ts)-1)$ is a real number, where Ts is the clock cycle, and f is a frequency at which a notch occurs. When the value of M is negative, the flying capacitor may have a differential structure, and the capacitor may be provided between the input terminal on a positive phase side and an output terminal on a negative phase side of the flying capacitor, and between the output terminal on the positive phase side and an input terminal on the negative phase side of the flying capacitor.

A capacity of the capacitor may be M times a capacity of a capacitor included in the flying capacitor, M being a value when M that is equal to $\exp(-j*2\pi f*Ts*J)/(\exp(-j*2\pi f*Ts)-1)$ is an imaginary number, where Ts is the clock cycle, and f is a frequency at which a notch occurs. The filter circuit may include two units of the flying capacitor having a differential structure, and one of the flying capacitor is supplied with a voltage that is expressed by a complex voltage.

According to another embodiment of the present invention, there is provided a communication device including the filter circuit.

According to the embodiments of the present invention described above, it is possible to provide a novel and improved filter circuit and communication device capable of having steep attenuation characteristics.

DETAILED DESCRIPTION OF THE EMBODIMENT(S)

Figure 1:
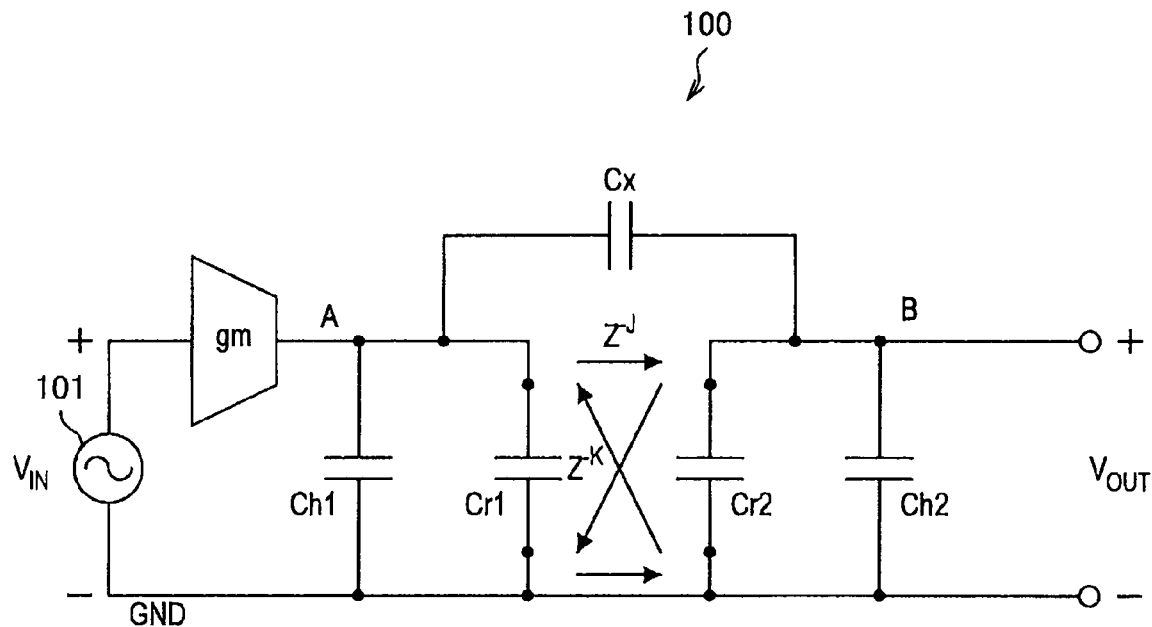
FIG. 1 is an explanatory diagram showing the structure of a charge domain infinite impulse response low pass filter (IIR-LPF) 100 according to an embodiment of the present invention.

Hereinafter, preferred embodiments of the present invention will be described in detail with reference to the appended drawings. Note that, in this specification and the appended drawings, structural elements that have substantially the same function and structure are denoted with the same reference numerals, and repeated explanation of these structural elements is omitted.

An exemplary embodiment of the present invention will be described in detail in the following order.

1. Charge domain second order IIR-LPF according to related art 1-1. Structure of charge domain second order IIR-LPF according to related art 1-2. Problems of charge domain second order IIR-LPF according to related art 2. LPF according to embodiment of the present invention 2-1. Structure of LPF according to embodiment of the present invention 2-2. Transfer function of LPF according to embodiment of the present invention 2-3. Frequency characteristics of LPF according to embodiment of the present invention 2-4. Example of circuit structure of LPF according to embodiment of the present invention 2-5. Modified example of LPF according to embodiment of the present invention 3. Communication device provided with LPF according to embodiment of the present invention 4. Conclusion

1. CHARGE DOMAIN SECOND ORDER IIR-LPF ACCORDING TO RELATED ART

First, before describing the exemplary embodiment of the present invention, a charge domain second order IIR-LPF according to related art will be described, and then problems thereof will be described.

1-1. Structure of Charge Domain Second Order IIR-LPF According to Related Art

Figure 22:
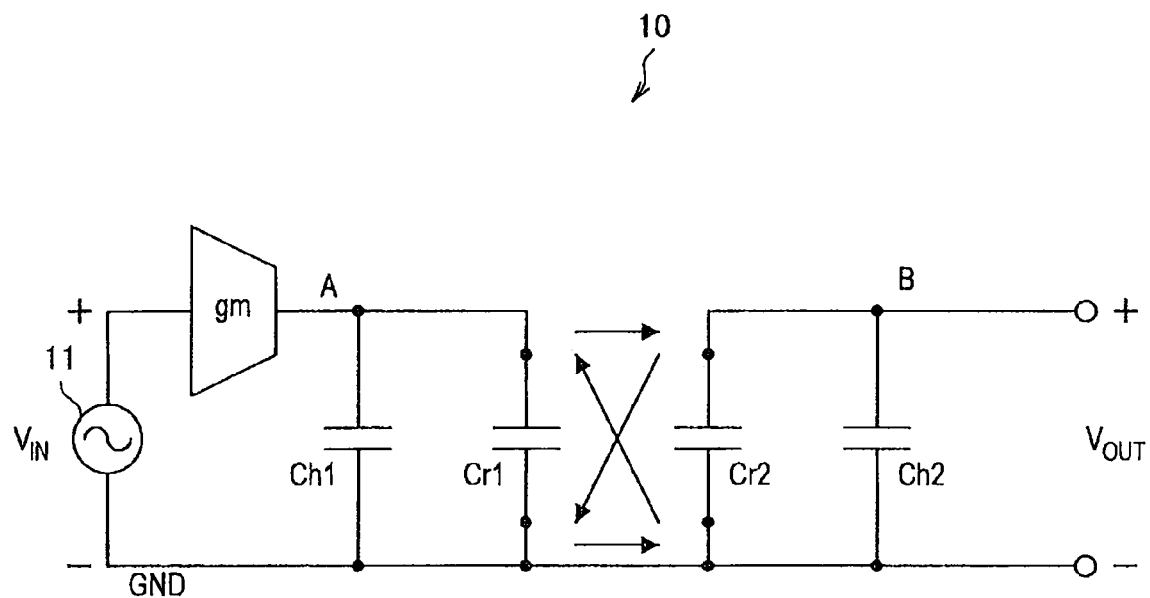
FIG. 22 is an explanatory diagram showing the structure of a charge domain second order IIR-LPF 10 according to related art.

FIG. 22 is an explanatory diagram showing the structure of a charge domain second order infinite impulse response low pass filter (IIR-LPF) 10 according to the related art, which is described in S. Manetti and A. Liberatore, "Switched-capacitor lowpass filter without active components," Electron. Lett., 1980, 16, pp. 883-885. Hereinafter, the structure of the charge domain second order IIR-LPF 10 according to the related art will be described with reference to FIG. 22.

As shown in FIG. 22, the charge domain second order IIR-LPF 10 according to the related art includes a power source 11, a transconductance amplifier gm, and capacitors Ch1, Ch2, Cr1 and Cr2.

The power source 11 is an AC power source, and outputs an input voltage signal $V_{IN}$. The transconductance amplifier gm is a transconductance amplifier that converts a voltage signal to a current signal and outputs it. The transconductance amplifier gm outputs, to an A point in FIG. 22, a current with an amplitude proportional to the input voltage signal $V_{IN}$ from the power source 11, and charges the capacitor Ch1.

The capacitors Cr1 and Cr2 move alternately between an A point side and a B point side in synchronization with a clock input to the LPF 10. Because of the capacitors Cr1 and Cr2 moving alternately between the A point side and the B point side, an electric charge can be transferred and received between the capacitor Ch1 and the capacitor Ch2. As a result, the capacitor Ch2 is charged, a voltage is generated at the B point in FIG. 22, and it is possible to output an output voltage signal $V_{OUT}$.

Figure 23:
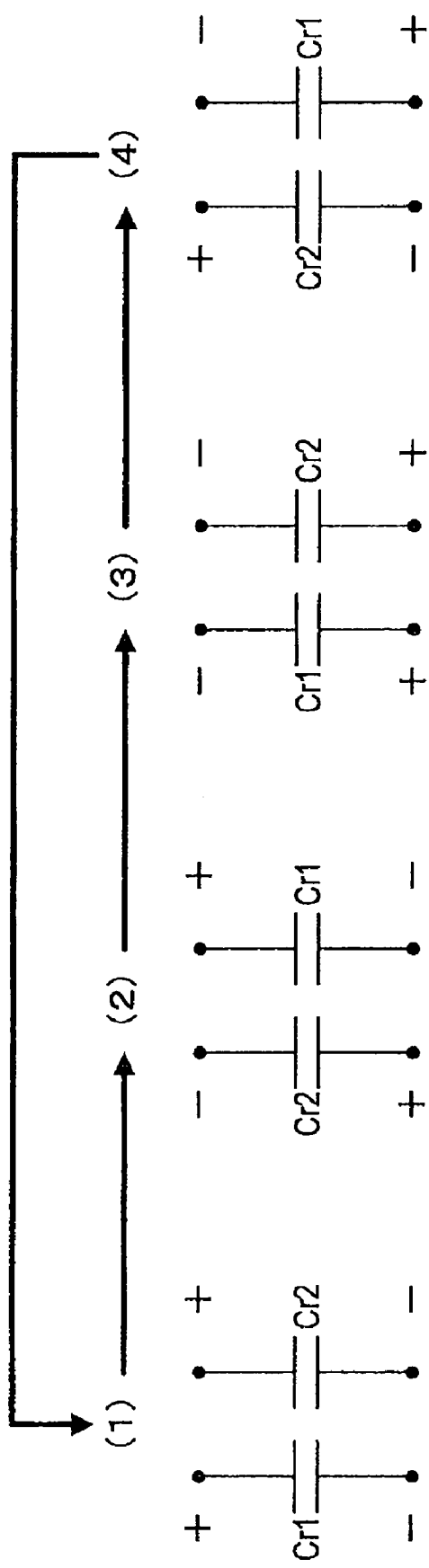
FIG. 23 is an explanatory diagram showing the regularity of movement of capacitors.

Here, the regularity of movement of the capacitors Cr1 and Cr2 will be described with reference to FIG. 23. When the capacitors Cr1 and Cr2 move from the A point side to the B point side in FIG. 22, the capacitors Cr1 and Cr2 move in parallel with each other while maintaining the same polarity. On the other hand, when the capacitors Cr1 and Cr2 move from the B point side to the A point side in FIG. 22, the capacitors Cr1 and Cr2 move while reversing the polarity. FIG. 23 shows a manner in which the capacitors Cr1 and Cr2 move, and the capacitors Cr1 and Cr2 are denoted with positive and negative codes that indicate their respective polarities. For explanatory convenience, (1) in FIG. 23 is referred to as a first state. In the first state, the capacitor Cr1 is located on the A side in FIG. 22, and the capacitor Cr2 is located on the B side in FIG. 22, the capacitors Cr1 and Cr2 both having a positive polarity.

Next, for explanatory convenience, (2) in FIG. 23 is referred to as a second state. In the second state, the capacitor Cr1 has moved such that the B side in FIG. 22 has a positive polarity. Meanwhile, the capacitor Cr2 has moved such that the A side in FIG. 22 has a negative polarity, namely, the polarity is reversed.

Next, for explanatory convenience, (3) in FIG. 23 is referred to as a third state. In the third state, the capacitor Cr2, the polarity of which was reversed in the second state, has moved such that the B side in FIG. 22 has a negative polarity. Meanwhile, the capacitor Cr1 has moved such that the A side in FIG. 22 has a negative polarity, namely, the polarity is reversed.

Next, for explanatory convenience, (4) in FIG. 23 is referred to as a fourth state. In the fourth state, the capacitor Cr1, the polarity of which was reversed in the third state, has moved such that the B side in FIG. 22 has a negative polarity. Meanwhile, the capacitor Cr2 has moved such that the A side in FIG. 22 has a positive polarity, namely, the polarity is reversed.

Then, in a state following the fourth state, the capacitor Cr2 has moved such that the B side in FIG. 22 has a positive polarity. Meanwhile, the capacitor Cr1 has moved such that the A side in FIG. 22 has a positive polarity, namely, the polarity is reversed. This is the same state as the first state. As the first state to the fourth state are repeated in synchronization with the clock in this manner, an electric charge can be transferred and received between the capacitor Ch1 and the capacitor Ch2.

Figure 24:
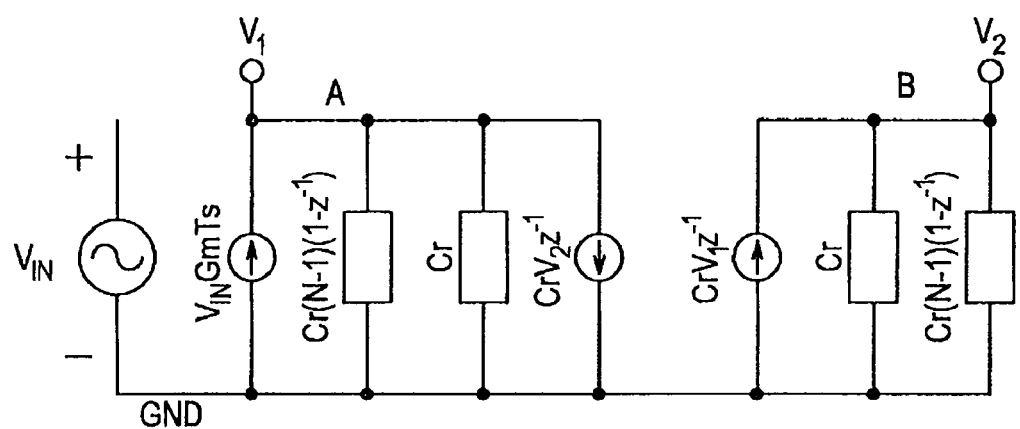
FIG. 24 is an explanatory diagram showing an equivalent circuit that is obtained by converting the LPF 10 shown in FIG. 22 to a z-domain equivalent circuit.

In order to obtain a transfer function of the LPF 10 shown in FIG. 22, the LPF 10 is converted to a z-domain equivalent circuit. FIG. 24 is an explanatory diagram showing an equivalent circuit that is obtained by converting the LPF 10 shown in FIG. 22 to the z-domain equivalent circuit. In the diagram shown in FIG. 24, the sampling clock cycle is denoted by Ts, the capacities of the capacitors Cr1 and Cr2 are both denoted by Cr, and the capacities of the capacitors Ch1 and Ch2 are both denoted by Cr·(N−1). Further, current sources illustrated in FIG. 24 indicate that current flows in an arrow direction per one sample, and rectangles illustrated in FIG. 24 indicate conductances.

When a voltage $V_1$ at an A point in FIG. 24 and a voltage $V_2$ at a B point in FIG. 24 are calculated according to Kirchhoff's first law, the following Expression 1 and Expression 2 are obtained.

$$V_1 = \frac{V_{IN} \cdot Gm \cdot Ts/Cr - V_2 \cdot z^{-1}}{(N-1) \cdot (1 - z^{-1}) + 1} \quad \text{Expression 1}$$

$$V_2 = \frac{V_1 \cdot z^{-1}}{(N-1) \cdot (1 - z^{-1}) + 1} \quad \text{Expression 2}$$

When $V_2/V_{IN}$ is obtained from the above Expression 1 and Expression 2, the following Expression 3 is obtained.

$$\frac{V_2}{V_{IN}} = \frac{Gm \cdot Ts}{Cr} \cdot \frac{z^{-1}}{\{N - (N-1) \cdot z^{-1}\}^2 + z^{-2}} \quad \text{Expression 3}$$

Figure 25:
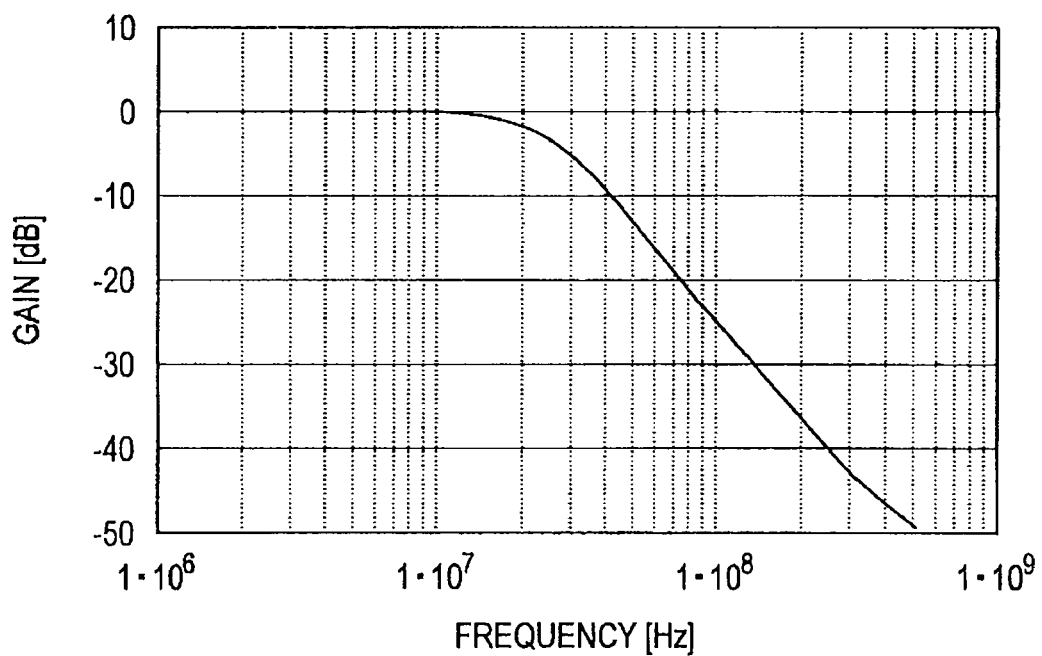
FIG. 25 is an explanatory diagram showing frequency characteristics of the equivalent circuit shown in FIG. 24.

If N=10, Ts=1.0 [ns], Gm=1 [mS], Ch=4.5 [pF], and Cr=0.5 [pF] are substituted in the above Expression 3, and further if it is taken into account that the charge sampling by the clock is performed in a rectangular time window, frequency characteristics of the equivalent circuit shown in FIG. 24 are obtained. FIG. 25 is an explanatory diagram showing the frequency characteristics of the equivalent circuit shown FIG. 24, in the form of a graph. This explanatory diagram is obtained by substituting the above values in Expression 3. As shown in FIG. 25, it can be found that the equivalent circuit shown in FIG. 24 has a low pass filter characteristic in which gradual attenuation starts from about 18 MHz.

Figure 26:
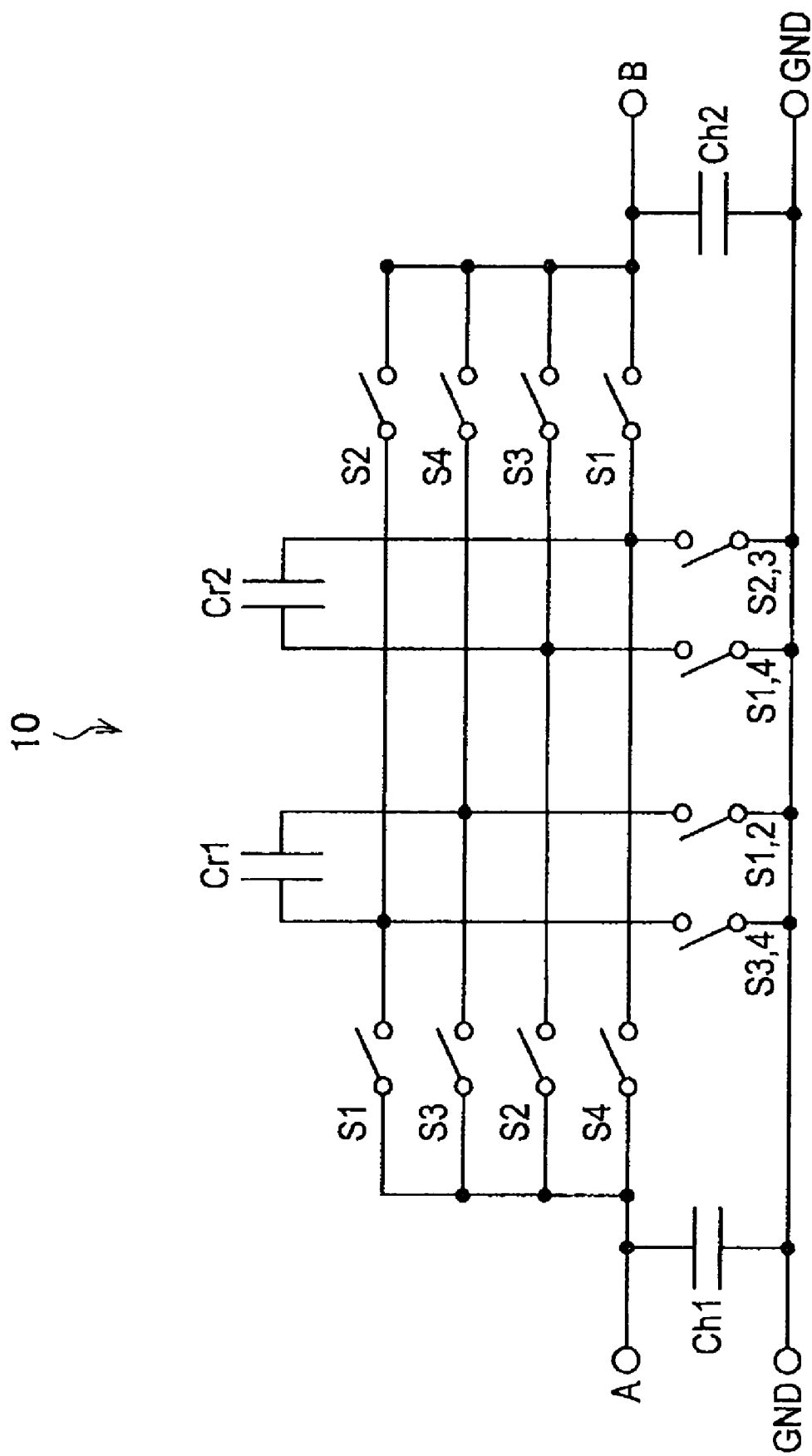
FIG. 26 is an explanatory diagram showing an actual circuit structure of the LPF 10 shown in FIG. 22.
Figure 27:
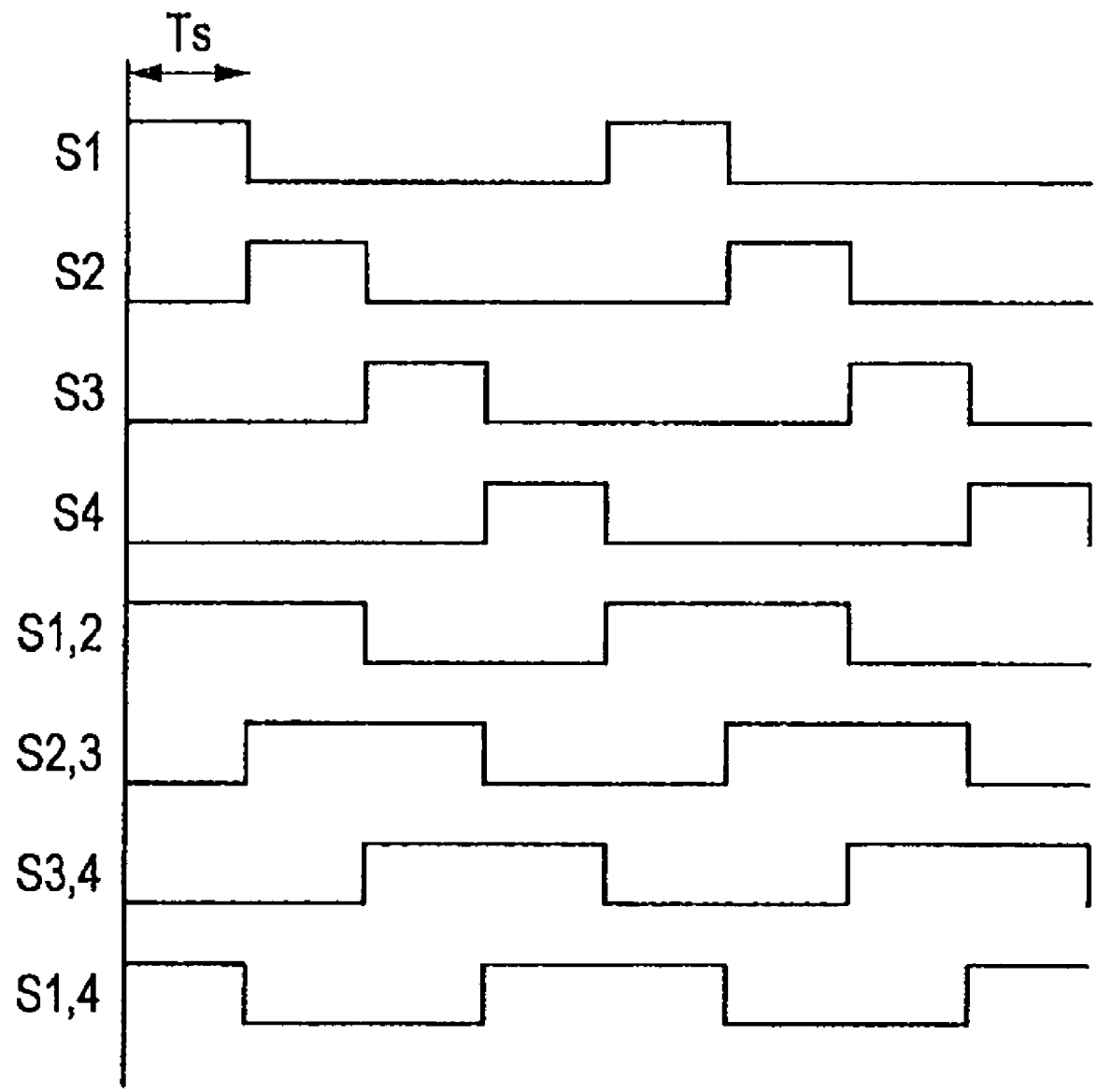
FIG. 27 is an explanatory diagram showing waveforms of clocks input to the LPF 10 shown in FIG. 26.

FIG. 26 is an explanatory diagram showing an actual circuit structure of the LPF 10 shown in FIG. 22. Further, FIG. 27 is an explanatory diagram showing waveforms of clocks input to the LPF 10 shown in FIG. 26. The circuit structure shown in FIG. 26 is obtained by extracting only a capacitor portion from the structure shown in FIG. 22 and illustrating it. Each of the clocks shown in FIG. 27 corresponds to each of the switches shown in FIG. 26. Each of the switches shown in FIG. 26 is turned on when each of the clocks shown in FIG. 27 is in a high level state, and is turned off when each of the clocks shown in FIG. 27 is in a low level state.

An operation of the LPF 10 shown in FIG. 26 will be described. When a clock S1, a clock S1, 2 and a clock S1, 4 are in a high level state, a switch S1, a switch S1, 2 and a switch S1, 4 in FIG. 26 are turned on. When these switches are turned on, the electric charge accumulated in the capacitor Ch1 moves to the capacitor Cr1, and the electric charge accumulated in the capacitor Cr2 moves to the capacitor Ch2.

Then, when a clock S2, the clock S1, 2 and a clock S2, 3 are in a high level state, a switch S2, the switch S1, 2 and a switch S2, 3 shown in FIG. 26 are turned on. When these switches are turned on, the electric charge accumulated in the capacitor Cr1 moves to the capacitor Ch2. Further, the pole of the capacitor Cr2 that is connected to the ground (GND) is reversed. Then, the electric charge accumulated in the capacitor Ch1 moves to the capacitor Cr2 whose pole has been reversed.

Next, when a clock S3, the clock S2, 3 and a clock S3, 4 are in a high level state, a switch S3, the switch S2, 3 and a switch S3, 4 shown in FIG. 26 are turned on. When these switches are turned on, the electric charge accumulated in the capacitor Cr2 moves to the capacitor Ch2. Further, the pole of the capacitor Cr1 that is connected to the GND is reversed, and the electric charge accumulated in the capacitor Ch1 moves to the capacitor Cr1.

Next, when a clock S4, the clock S3, 4 and a clock S1, 4 are in a high level state, a switch S4, the switch S3, 4 and a switch S1, 4 shown in FIG. 26 are turned on. When these switches are turned on, the electric charge accumulated in the capacitor Cr1 moves to the capacitor Ch2. Further, the pole of the capacitor Cr2 that is connected to the GND is reversed, and the electric charge accumulated in the capacitor Ch1 moves to the capacitor Cr2.

If turning on and off of the switches is repeated in response to the switching of high and low levels of the clocks in this manner, the electric charge accumulated in the capacitor Ch1 moves to the capacitor Ch2 via the capacitors Cr1 and Cr2. As a result, the LPF 10 operates as a low pass filter that has the frequency pass characteristics shown in FIG. 25. The operation in which electric charge moves while the polarities at both ends of the capacitors Cr1 and Cr2 are switched as shown in FIG. 26 is generally called a flying capacitor method.

1-2. Problems of Charge Domain Second Order IIR-LPF According to Related Art

As described above, the charge domain second order IIR-LPF 10 according to the related art disclosed in S. Manetti and A. Liberatore, "Switched-capacitor lowpass filter without active components," Electron. Lett., 1980, 16, pp. 883-885 has an advantage that a second order IIR-LPF can be realized with a simple charge domain circuit. However, as shown in FIG. 25, the attenuation characteristics are moderate in the vicinity of the cut off frequency (i.e., the frequency equivalent to −3 dB), and a steep filter structure cannot be realized.

To address this, the present invention provides a charge domain LPF circuit that has steep attenuation characteristics by adding a notch to frequency characteristics. Hereinafter, an exemplary embodiment of the present invention will be described with reference to the appended drawings.

2. LPF ACCORDING TO EMBODIMENT OF THE PRESENT INVENTION

2-1. Structure of LPF According to Embodiment of the Present Invention

FIG. 1 is an explanatory diagram showing the structure of a charge domain infinite impulse response low pass filter (IIR-LPF) 100 according to an embodiment of the present invention. Hereinafter, the structure of the charge domain IIR-LPF 100 (hereinafter also simply referred to as the "LPF 100") according to the embodiment of the present invention will be described with reference to FIG. 1.

As shown in FIG. 1, the LPF 100 according to the embodiment of the present invention includes a power source 101, a transconductance amplifier gm, and capacitors Ch1, Ch2, Cr1, Cr2 and Cx.

The power source 101 is an AC power source, and outputs an input voltage signal $V_{IN}$. The transconductance amplifier gm is a transconductance amplifier that converts a voltage signal to a current signal and outputs it. The transconductance amplifier gm outputs, to an A point in FIG. 1, a current with an amplitude proportional to the input voltage signal $V_{IN}$ from the power source 101, and charges the capacitor Ch1 and the capacitor Cx.

The capacitors Cr1 and Cr2 move alternately between an A point side and a B point side in synchronization with a clock input to the LPF 100. Because of the capacitors Cr1 and Cr2 moving alternately between the A point side and the B point side, an electric charge can be transferred and received between the capacitor Ch1 and the capacitor Ch2. As a result, the capacitor Ch2 is charged, a voltage is generated at the B point in FIG. 1, and it is possible to output an output voltage signal $V_{OUT}$.

The LPF 100 shown in FIG. 1 is different from the LPF 10 of the related art shown in FIG. 22 in that the capacitor Cx is provided between the A point and the B point. Additionally, unlike the LPF 10 of the related art, a delay time when the capacitors Cr1 and Cr2 move from the A point side to the B point side is expressed as a J clock, and a delay time when the capacitors Cr1 and Cr2 move from the B point side to the A point side is expressed as a K clock. Note that both J and K are natural numbers that are equal to or more than 1.

Figure 2:
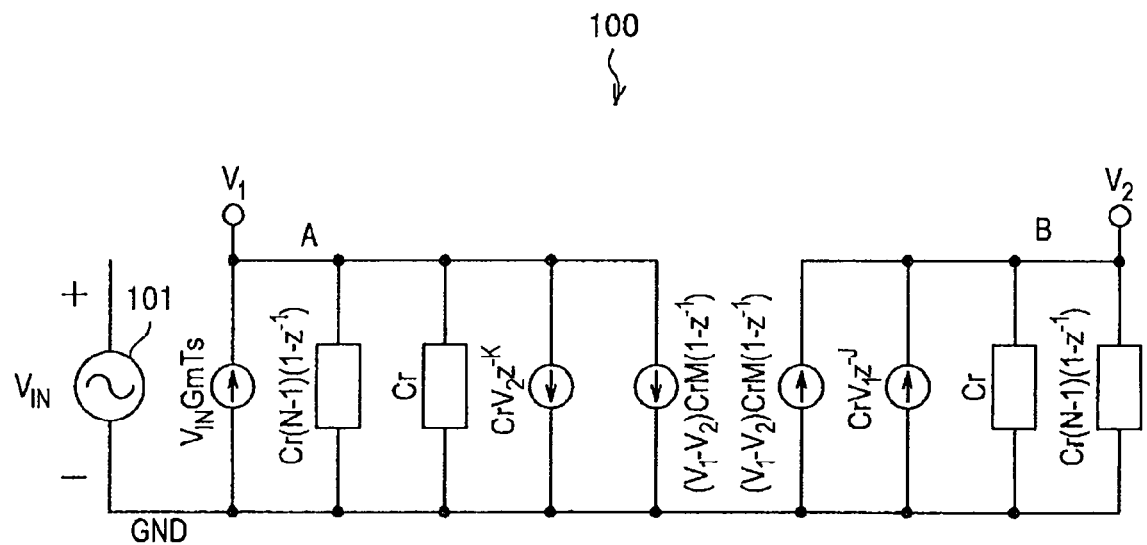
FIG. 2 is an explanatory diagram showing an equivalent circuit that is obtained by converting the LPF 100 shown in FIG. 1 to a z-domain equivalent circuit.

2-2. Transfer Function of LPF According to Embodiment of the Present Invention The structure of the charge domain IIR-LPF 100 according to the embodiment of the present invention is described above. Here, in order to obtain a transfer function of the LPF 100 shown in FIG. 1, the LPF 100 is converted to a z-domain equivalent circuit. FIG. 2 is an explanatory diagram showing an equivalent circuit that is obtained by converting the LPF 100 shown in FIG. 1 to the z-domain equivalent circuit. In the diagram shown in FIG. 2, the sampling clock cycle is denoted by Ts, the capacities of the capacitors Cr1 and Cr2 are both denoted by Cr, the capacity of the capacitor Cx is denoted by M·Cr, which is M times the Cr, and the capacities of the capacitors Ch1 and Ch2 are both denoted by Cr (N−1). Further, current sources illustrated in FIG. 2 indicate that current flows in an arrow direction per one sample, and rectangles illustrated in FIG. 2 indicate conductances.

When a voltage $V_1$ at an A point in FIG. 2 and a voltage $V_2$ at a B point in FIG. 2 are calculated according to Kirchhoff's first law, the following Expression 4 and Expression 5 are obtained.

$$V_1 = \frac{V_{IN} \cdot Gm \cdot Ts/Cr - V_2 \cdot z^{-K} - (V_1 - V_2) \cdot P(z)}{Q(z)} \quad \text{Expression 4}$$

$$V_2 = \frac{V_1 \cdot z^{-J} + (V_1 - V_2) \cdot P(z)}{Q(z)} \quad \text{Expression 5}$$

Note that P(z) and Q(z) in the above Expression 4 and Expression 5 are obtained by the following Expression 6 and Expression 7, respectively.

$$P(z) = M \cdot (1 - z^{-1}) \quad \text{Expression 6}$$

$$Q(z) = (N-1) \cdot (1 - z^{-1}) + 1 \quad \text{Expression 7}$$

When $V_2/V_{IN}$ is obtained from the above Expression 4 to Expression 7, the following Expression 8 is obtained.

$$H_{V2}(z) = \quad \text{Expression 8}$$
$$\frac{V_2}{V_{IN}} = \frac{Gm \cdot Ts}{Cr} \cdot \frac{1}{W_1(z) \cdot Q_1(z) + z^{-K} + P(z) \cdot W_1(z) - P(z)}$$

Note that $W_1(z)$ in the above Expression 8 is obtained by the following Expression 9.

$$W_1(z) = \frac{V_1}{V_2} = \frac{Q(z) + P(z)}{z^{-J} + P(z)} \quad \text{Expression 9}$$

Figure 3:
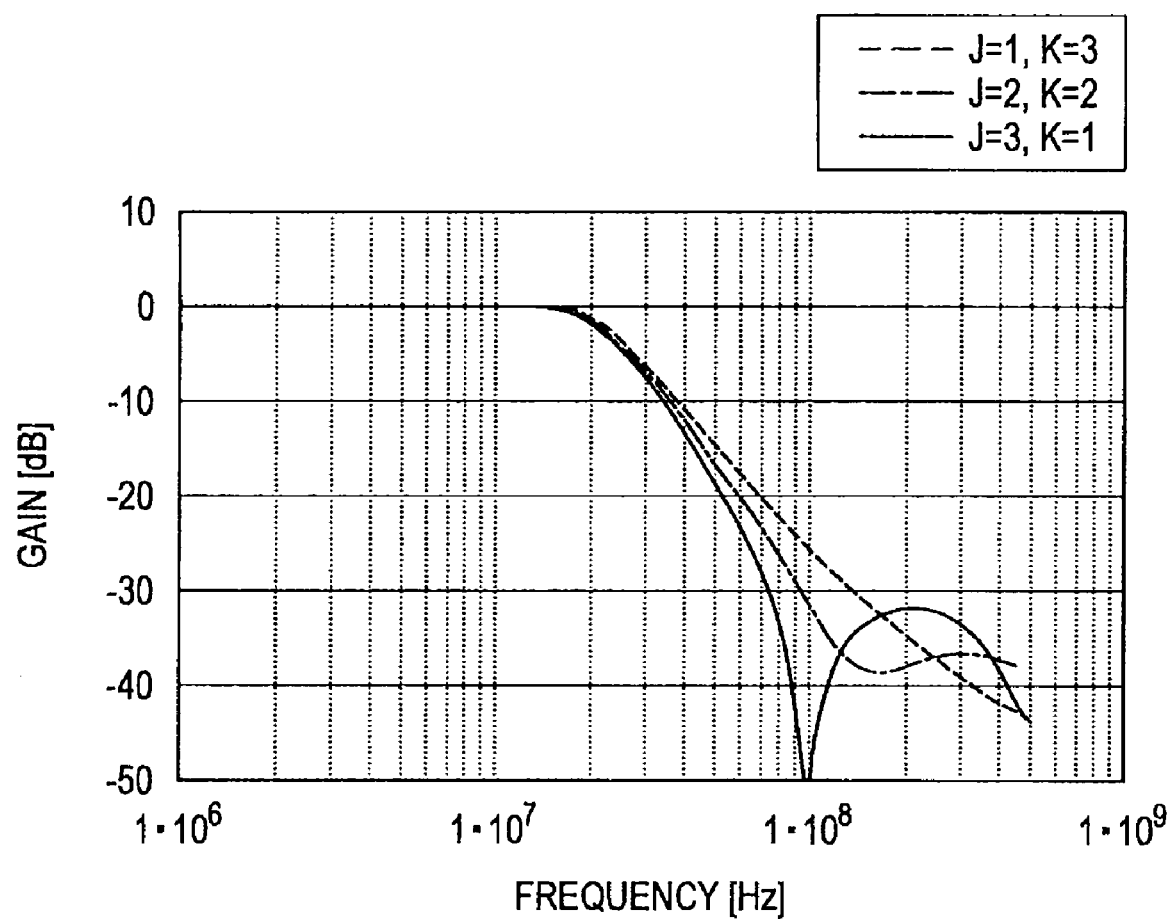
FIG. 3 is an explanatory diagram showing an example of frequency characteristics of the LPF 100.

2-3. Frequency Characteristics of LPF According to Embodiment of the Present Invention The transfer function of the LPF 100 shown in FIG. 1 is obtained in this manner. Here, N=10, M=1.618, Ts=1.0 [ns], Gm=1 [mS], Cr=0.5 [pF] are set in the equivalent circuit of the LPF 100 shown in FIG. 2. Further, if the frequency characteristics of the LPF 100 are obtained from the above Expression 8, using combinations of J and K as parameters in a range of J+K=4, the frequency characteristics shown in FIG. 3 are obtained. In FIG. 3, the frequency characteristics are shown for each of three cases, i.e., a case of J=1, K=3, a case of J=2, K=2, and a case of J=3, K=1.

If the frequency characteristics of the LPF 10 according to the related art shown in FIG. 25 are compared with the frequency characteristics of the LPF 100 according to the embodiment of the present invention shown in FIG. 3, it can be seen that, in the case of J=1, K=3, the same frequency characteristics as the LPF 10 according to the related art shown in FIG. 25 are obtained. In the case of J=3, K=1, a deep notch of −50 [dB] occurs at 100 [MHz], and it can be seen that the LPF 100 has steep attenuation characteristics. Further, in the case of J=2, K=2, it can be seen that a moderate notch of −37 [dB] occurs at about 150 [MHz]. By setting the parameters in this way, a notch can be generated at a determined frequency, and a LPF that has steep attenuation characteristics can be obtained.

Here, conditions in which notches occur as shown in FIG. 3 in the frequency characteristics of the LPF 100 according to the embodiment of the present invention will be described. If a notch occurs, it means that the voltage $V_2$ at the B point becomes zero at the corresponding frequency, regardless of the voltage $V_1$ at the A point in FIG. 2. Therefore, if $V_2=0$ is substituted into the numerator of the above Expression 5 and calculated, the following Expression 10 can be derived.

$$z^{-J}+M\cdot(1-z^{-1})=0 \qquad \text{Expression 10}$$

When $z=\exp(J\cdot 2\pi\cdot f\cdot Ts)$ is substituted for z into Expression 10 and M is calculated, the following Expression 11 is derived.

$$M = \frac{\exp(-j\cdot 2\pi\cdot f\cdot Ts\cdot J)}{\exp(-j\cdot 2\pi\cdot f\cdot Ts)-1} \qquad \text{Expression 11}$$

Figure 4:
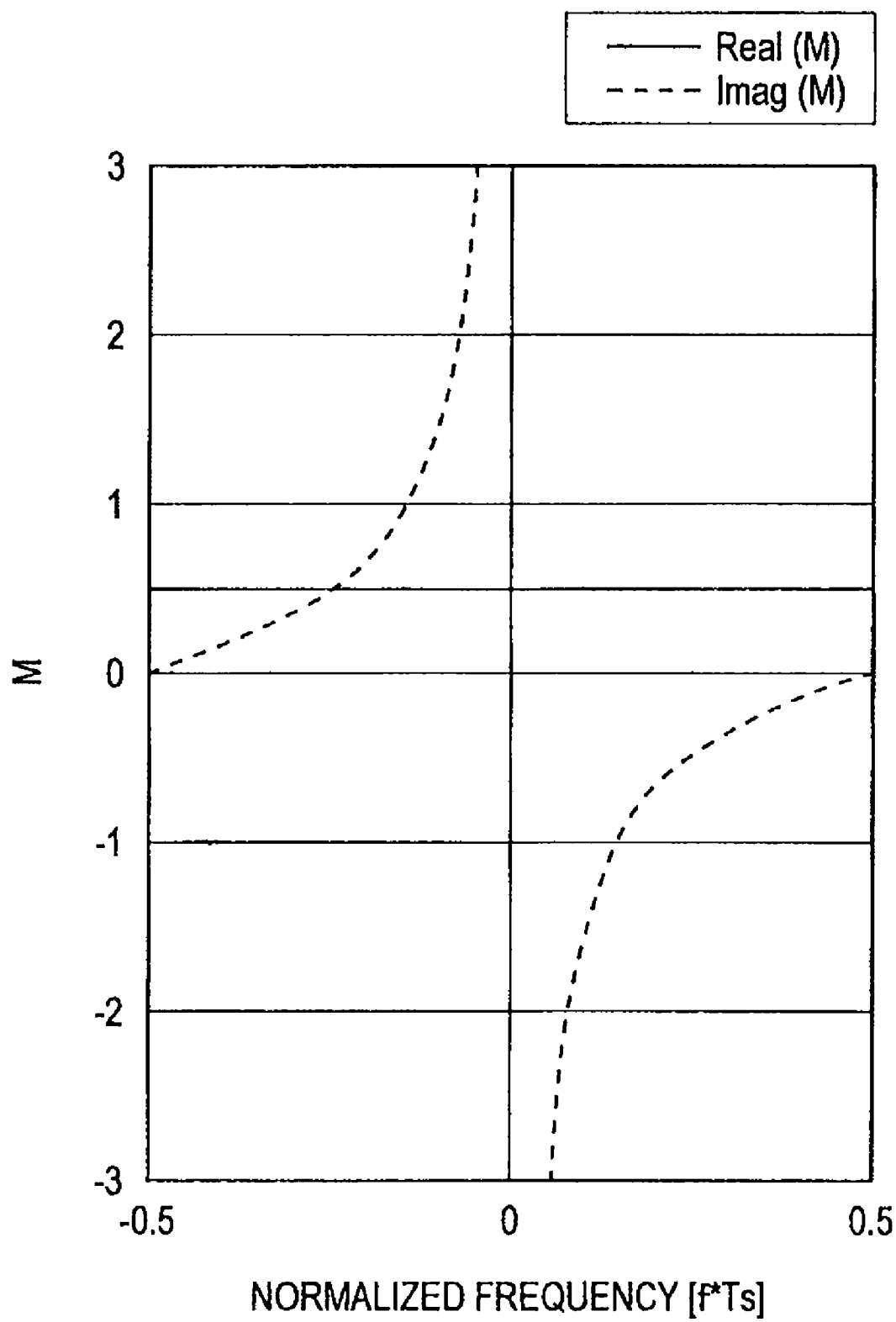
FIG. 4 is an explanatory diagram showing a relationship between a normalized frequency and a real part and an imaginary part of M, in the form of a graph.
Figure 5:
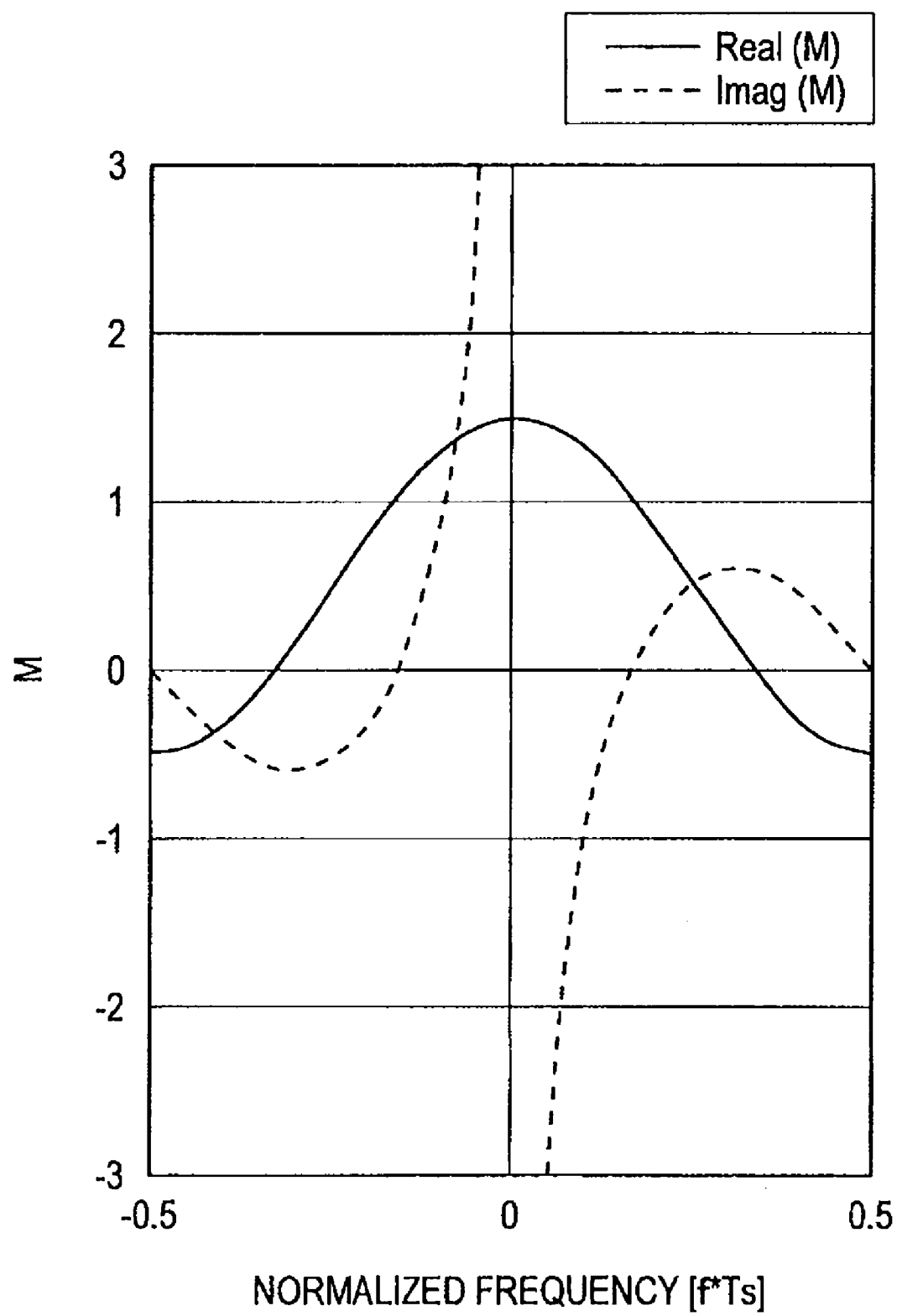
FIG. 5 is an explanatory diagram showing a relationship between the normalized frequency and the real part and the imaginary part of M, in the form of a graph.
Figure 6:
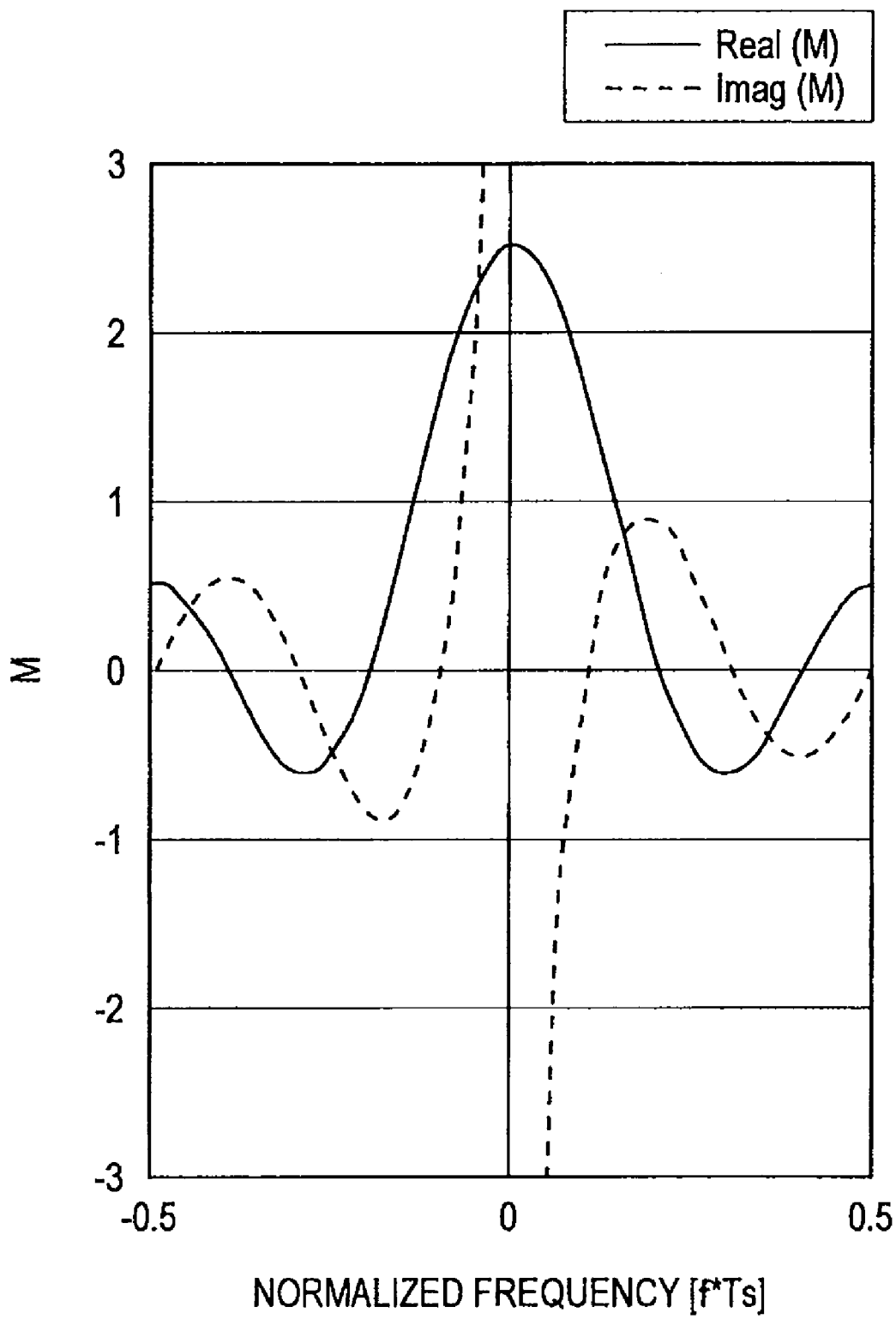
FIG. 6 is an explanatory diagram showing a relationship between the normalized frequency and the real part and the imaginary part of M, in the form of a graph.

If a real part and an imaginary part of M obtained from Expression 11 are respectively normalized for cases when J=1, J=2, or J=3, using the sampling clock cycle Ts, and the normalized frequency is taken as the horizontal axis to form a graph, the normalized frequency and the value of M at which a notch occurs can be derived using J as a parameter. FIG. 4 is an explanatory diagram showing a relationship between the normalized frequency and the real part and the imaginary part of M when J=1, in the form of a graph. FIG. 5 is an explanatory diagram showing a relationship between the normalized frequency and the real part and the imaginary part of M when J=2, in the form of a graph. FIG. 6 is an explanatory diagram showing a relationship between the normalized frequency and the real part and the imaginary part of M when J=3, in the form of a graph.

The real part of M in Expression 11 is an even function, and the imaginary part of M is an odd function. Therefore, when M is a real number, the values of M are the same at positive and negative frequencies. Based on this condition, the normalized frequency of the notch and the value of M can be obtained using J as a parameter.

If J=1 as shown in FIG. 4, M is a real number when its imaginary part is zero, namely, when the normalized frequency is ½. From the graph in FIG. 4, when the normalized frequency is ½, the value of M is 0.5. Note that, as shown in FIG. 4, when J=1, the value of M is 0.5 and is constant.

If J=2 as shown in FIG. 5, M is a real number when its imaginary part is zero, namely, when the normalized frequency is ⅙ or ⅜ (=½). From the graph in FIG. 5, when the normalized frequency is ⅙, the value of M is 1.0, and when the normalized frequency is ½, the value of M is −0.5.

If J=3 as shown in FIG. 6, M is a real number when its imaginary part is zero, namely, when the normalized frequency is ¹⁄₁₀, ³⁄₁₀ or ⁵⁄₁₀ (=½). From the graph in FIG. 6, when the normalized frequency is ¹⁄₁₀, the value of M is 1.618, when the normalized frequency is ³⁄₁₀, the value of M is −0.618, and when the normalized frequency is ½, the value of M is 0.5.

Figure 7:
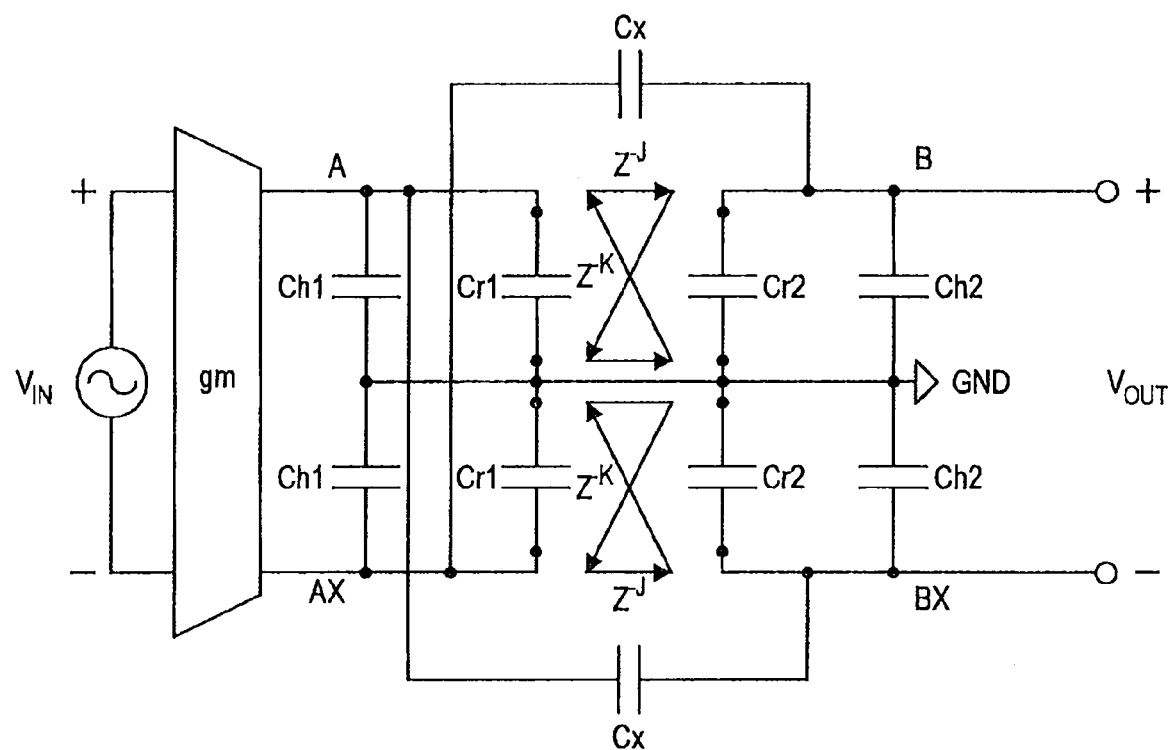
FIG. 7 is an explanatory diagram showing an example of the structure of a charge domain IIR-LPF that has a differential structure.

Note that, when J=2 or J=3, the value of M may be negative in some cases. This does not mean that the capacity of the capacitor Cx shown in FIG. 1 becomes negative. This means that, for example as shown in FIG. 7, the IIR-LPF has a differential structure, and an A point on the positive phase side of a differential circuit and a BX point on the negative phase side are connected, and an AX point on the negative phase side and a B point on the positive phase side are connected, whereby the capacitors Cx are cross connected between the positive phase side and the negative phase side.

Next, let us assume a case where the value of M does not include the real part and is a pure imaginary number. When J=1 as shown in FIG. 4, the value of M is 0.5 and is constant. Therefore, the value of M is not a pure imaginary number that does not include the real part.

When J=2 as shown in FIG. 5, when the real part of M is zero, namely, when the normalized frequency is ⅓ or −⅓, the value of M is a pure imaginary number that does not include the real part. Further, from the graph in FIG. 5, when the normalized frequency is −⅓, the value of M is −j*0.577, and when the normalized frequency is ⅓, the value of M is j*0.577.

When J=3 as shown in FIG. 6, when the real part of M is zero, namely, when the normalized frequency is ⅕, −⅕, ⅖ or −⅖, the value of M is a pure imaginary number that does not include the real part. Further, from the graph in FIG. 6, when the normalized frequency is −⅕, the value of M is −j*0.851, and when the normalized frequency is ⅕, the value of M is j*0.851. Further, when the normalized frequency is −⅖, the value of M is −j*0.526, and when the normalized frequency is ⅖, the value of M is j*0.526.

Figure 8:
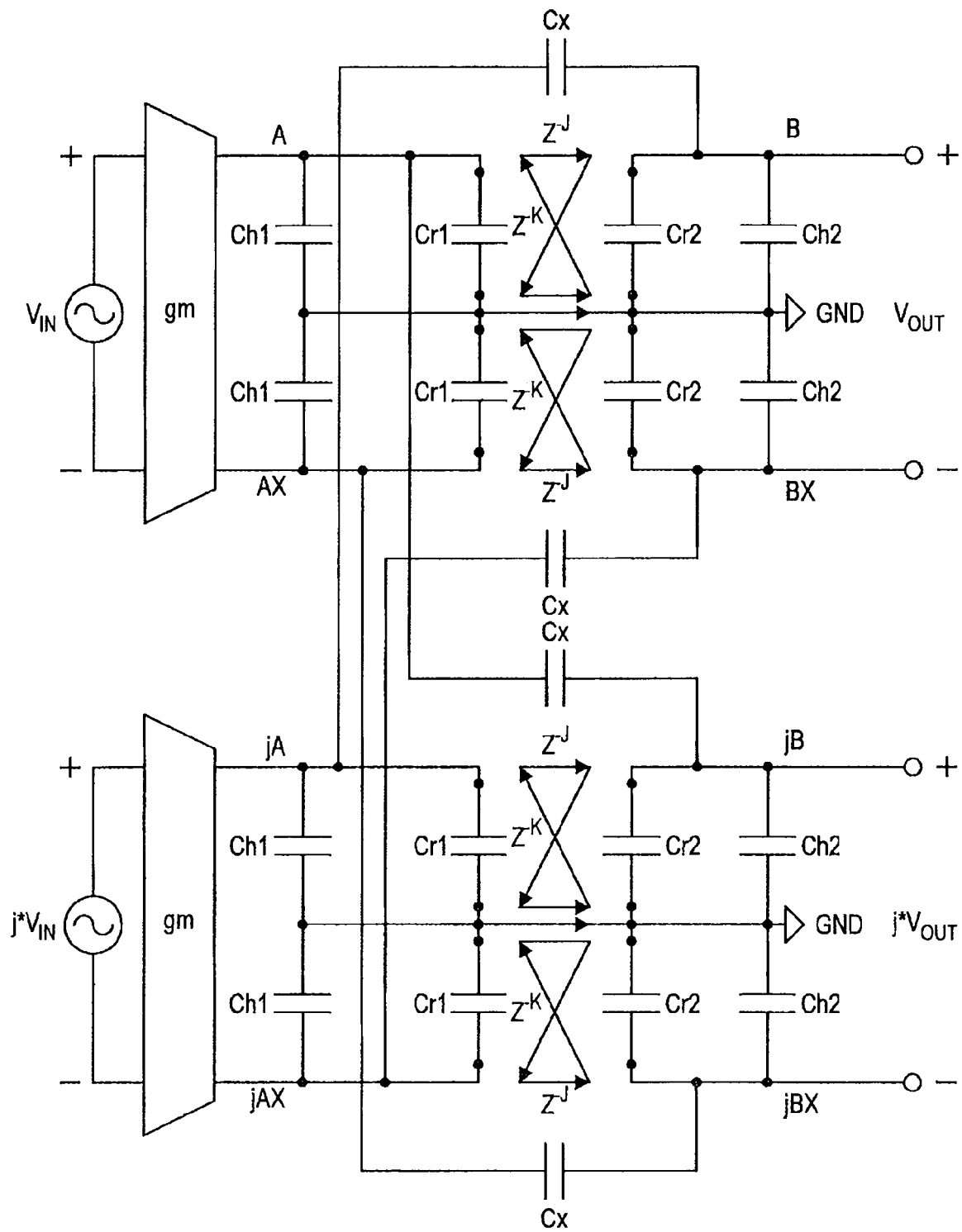
FIG. 8 is an explanatory diagram showing an example of the structure of a charge domain IIR-LPF that has a differential structure and can use a complex voltage.

Note that, when J=2 or J=3, the value of M may be a pure imaginary number in some cases. This does not mean that the capacity of the capacitor Cx shown in FIG. 1 becomes a pure imaginary number. This means that, for example as shown in FIG. 8, two sets of differential circuits are used so that complex voltage can be used. More specifically, in the differential circuits shown in FIG. 8, a jA point on the imaginary number side and a B point on the real number side are connected, a jAX point on the imaginary number side and a BX point on the real number side are connected, an A point on the real number side and a jB point on the imaginary number side are connected, and an AX point on the real number side and a jBX point on the imaginary number side are connected, these points being connected by the capacitors Cx, respectively.

Figure 9:
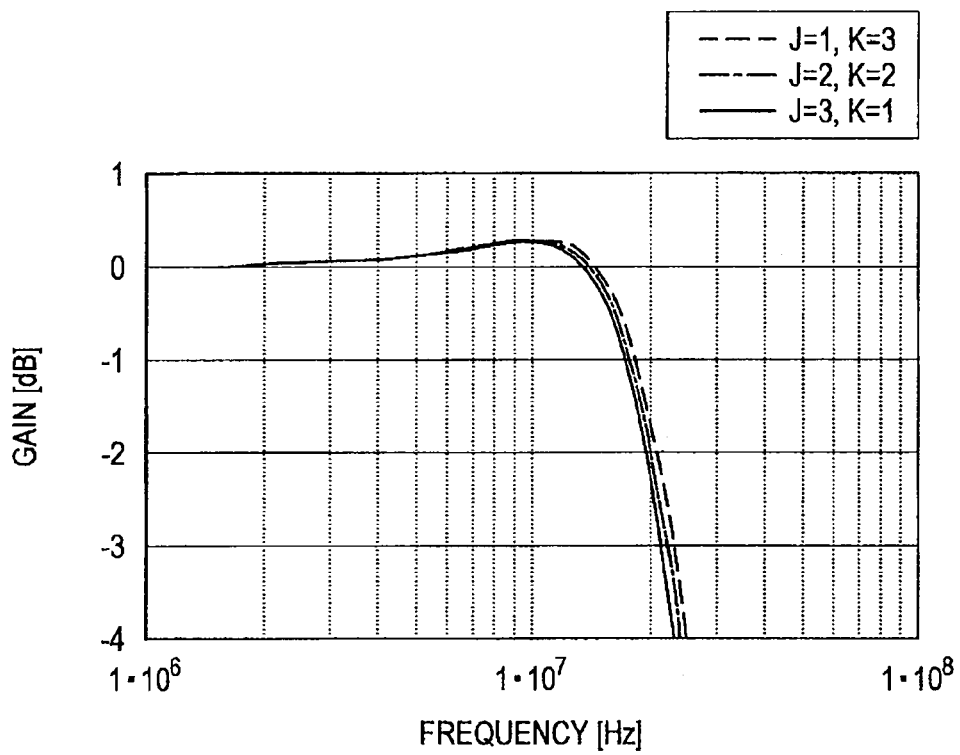
FIG. 9 is an explanatory diagram showing the frequency characteristics shown in FIG. 3, the diagram being enlarged in the vicinity of the cut-off frequency.

FIG. 9 shows the frequency characteristics of the LPF 100 according to the embodiment of the present invention shown in FIG. 3. The graph shown in FIG. 9 is enlarged in the vicinity of the cut-off frequency. As shown in FIG. 9, within a pass band, three frequency characteristics overlap with each other up to about 10 [MHz]. Accordingly, it can be found that the frequency characteristics are generally the same regardless of changes in the value of J.

Next, N=10, M=1.618, Ts=1.0 [ns], Gm=1 [mS] and Cr=0.5 [pF] are set. Further, K is set to be constant at K=1, and J only is used as a parameter. In this condition, if the frequency characteristics of the LPF 100 are obtained from the above Expression 8, the frequency characteristics shown in FIG. 10 are obtained.

Figure 10:
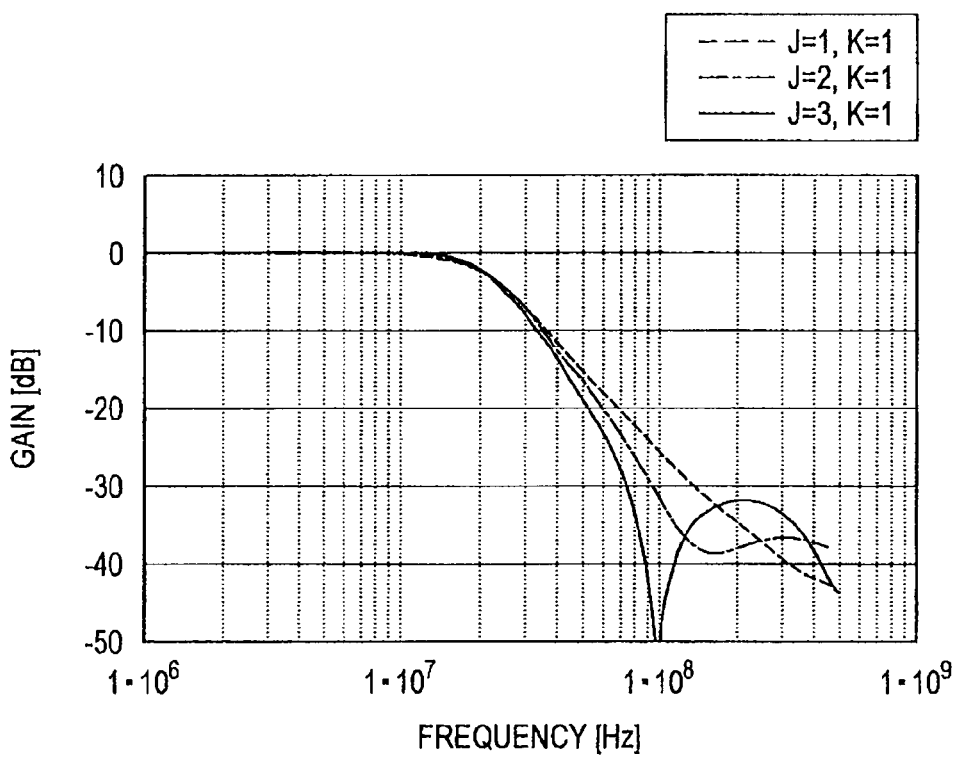
FIG. 10 is an explanatory diagram showing an example of the frequency characteristics of the LPF 100.
Figure 11:
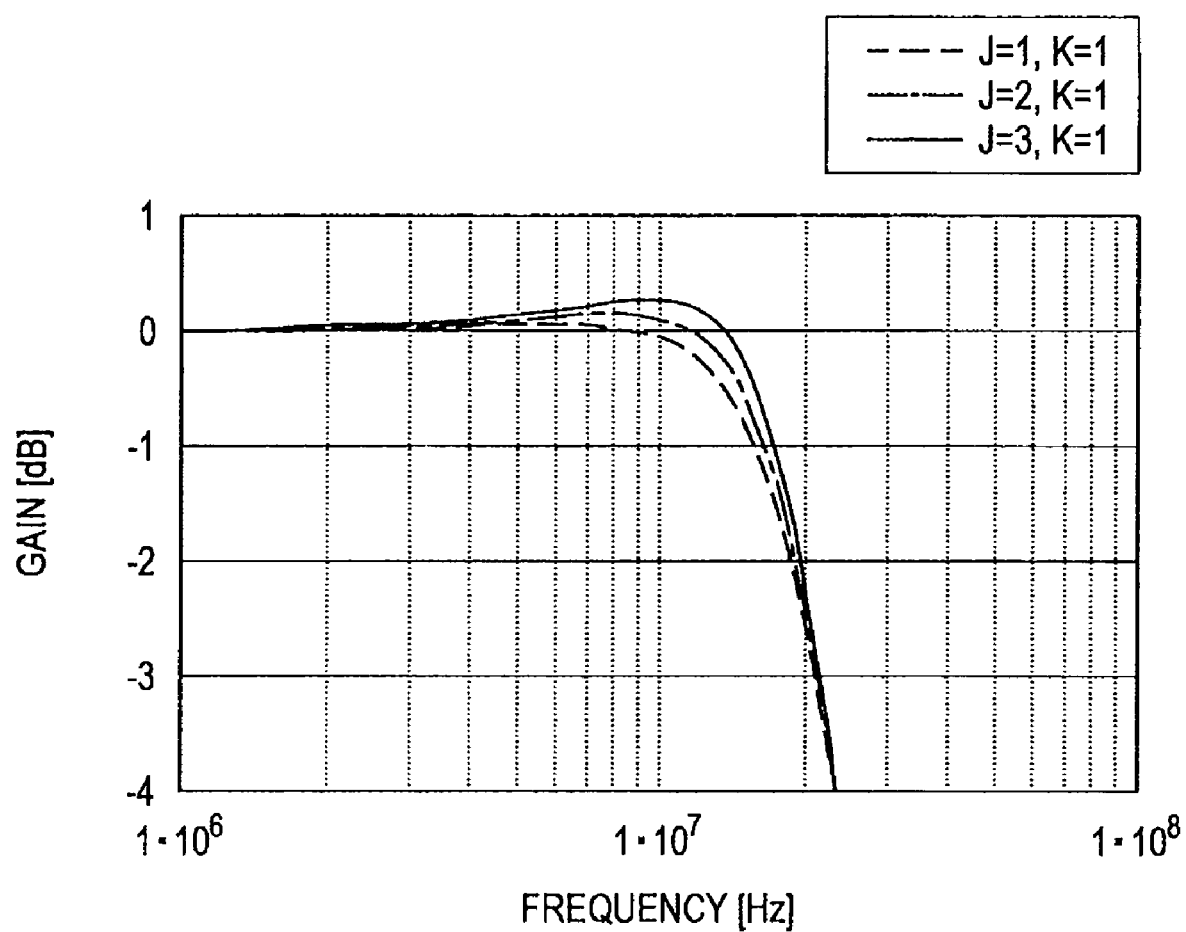
FIG. 11 is an explanatory diagram showing the frequency characteristics shown in FIG. 10, the diagram being enlarged in the vicinity of the cut-off frequency.

If the frequency characteristics shown in FIG. 3 and the frequency characteristics shown in FIG. 10 are compared, it can be seen that almost the same frequency characteristics are exhibited as a whole. Here, FIG. 11 shows the frequency characteristics of the LPF 100 according to the embodiment of the present invention shown in FIG. 10. The graph shown in FIG. 11 is enlarged in the vicinity of the cut off frequency. As can be seen from the graph shown in FIG. 11, three frequency characteristics are different from each other at 10 [MHz] within the pass band, and further the three frequency characteristics intersect in the vicinity of a cut off frequency of 23 [MHz]. In this manner, the value of K, namely, the number of delay clocks when the capacitors Cr1 and Cr2 move from the B point side to the A point side of the LPF 100 is fixed. Then, by changing the number J of delay clocks when the capacitors Cr1 and Cr2 move from the A point side to the B point side of the LPF 100, it is possible to change the frequency characteristics of the LPF 100.

Figure 12:
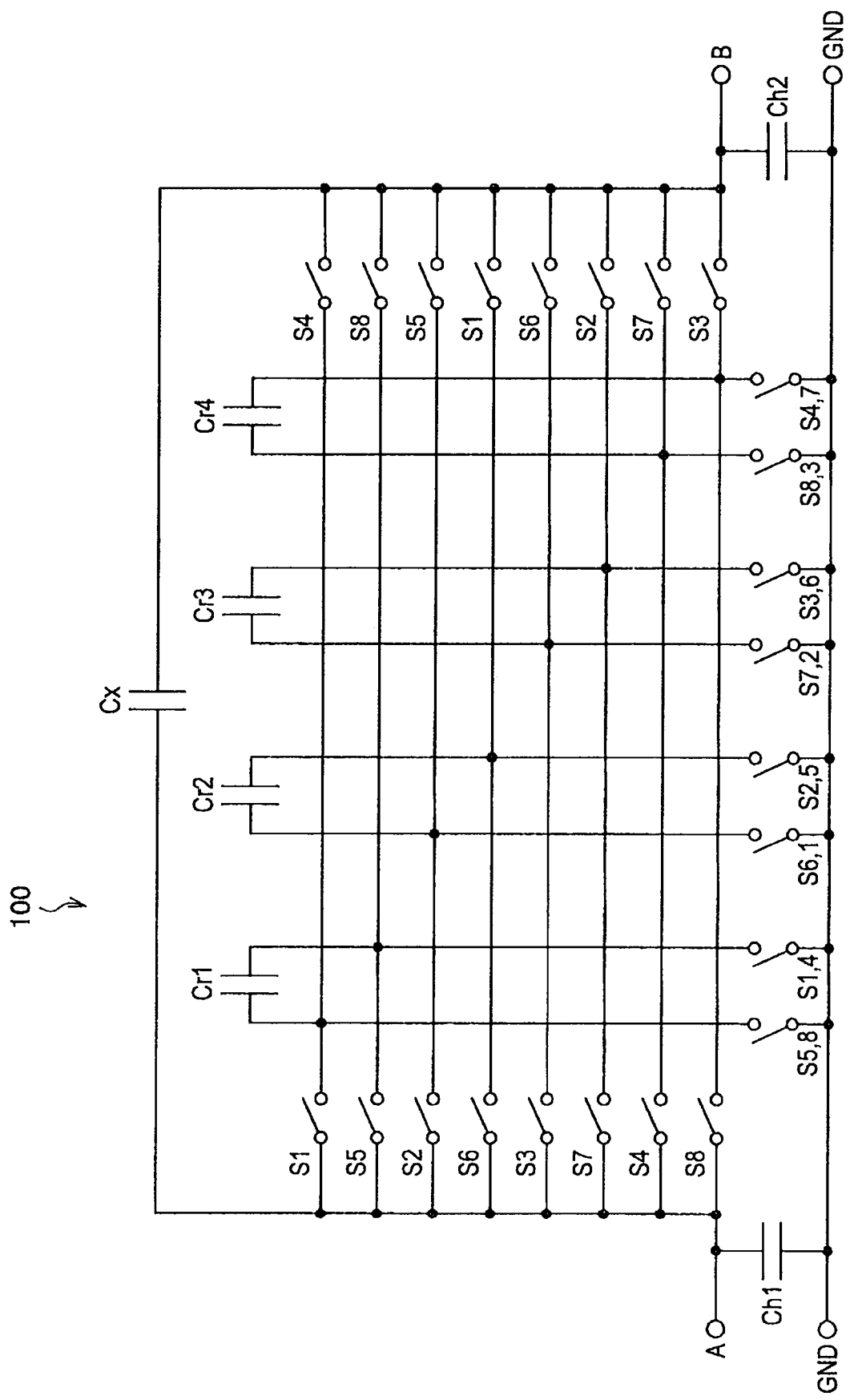
FIG. 12 is an explanatory diagram showing an example of the circuit structure of the LPF 100 according to the embodiment of the present invention.
Figure 13:
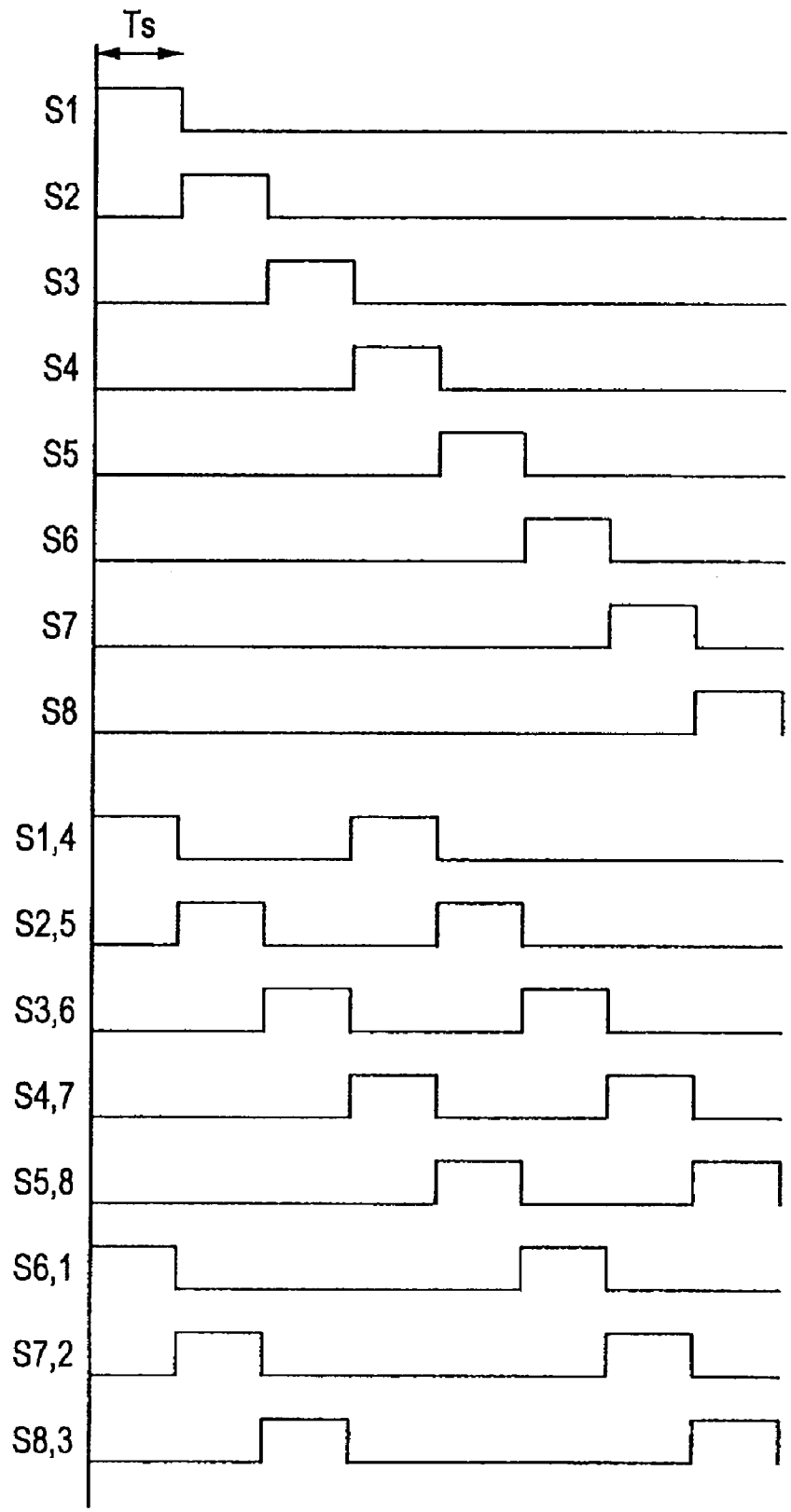
FIG. 13 is an explanatory diagram showing waveforms of clocks input to the LPF 100 shown in FIG. 12.

2-4. Example of Circuit Structure of LPF According to Embodiment of the Present Invention FIG. 12 is an explanatory diagram showing an example of the circuit structure of the LPF 100 according to the embodiment of the present invention when J=3 and K=1. FIG. 13 is an explanatory diagram showing waveforms of clocks input to the LPF 100 shown in FIG. 12. The circuit structure shown in FIG. 12 is obtained by extracting only a capacitor portion from the structure shown in FIG. 1 and illustrating it. Each of the clocks shown in FIG. 13 corresponds to each of the switches shown in FIG. 12. Each of the switches shown in FIG. 12 is turned on when each of the clocks shown in FIG. 13 is in a high level state, and is turned off when each of the clocks shown in FIG. 13 is in a low level state.

An operation of the LPF 100 shown in FIG. 12 will be described. When a clock S1, a clock S1, 4 and a clock S6, 1 are in a high level state, a switch S1, a switch S1, 4 and a switch S6, 1 in FIG. 12 are turned on. When these switches are turned on, the electric charge accumulated in the capacitor Ch1 moves to the capacitor Cx and the capacitor Cr1, and the electric charge accumulated in the capacitor Cr2 moves to the capacitor Ch2.

Next, when a clock S2, a clock S2, 5 and a clock S7, 2 are in a high level state, a switch S2, a switch S2, 5 and a switch S7, 2 shown in FIG. 12 are turned on. When these switches are turned on, the electric charge accumulated in the capacitor Cr3 moves to the capacitor Ch2. Further, the pole of the capacitor Cr2 that is connected to the GND is reversed, and the electric charge accumulated in the capacitor Ch1 moves to the capacitor Cx and the capacitor Cr2 whose pole has been reversed. More specifically, after one clock from when the electric charge of the capacitor Cr2 moves to the capacitor Ch2, the pole of the capacitor Cr2 is reversed, and the electric charge of the capacitor Ch1 moves to the capacitor Cr2.

Next, when a clock S3, a clock S3, 6 and a clock S8, 3 are in a high level state, a switch S3, a switch S3, 6 and a switch S8, 3 shown in FIG. 12 are turned on. When these switches are turned on, the electric charge accumulated in the capacitor Cr4 moves to the capacitor Ch2. Further, the pole of the capacitor Cr3 that is connected to the GND is reversed. Then, the electric charge accumulated in the capacitor Ch1 moves to the capacitor Cx and the capacitor Cr3 whose pole has been reversed. More specifically, after one clock from when the electric charge of the capacitor Cr3 moves to the capacitor Ch2, the pole of the capacitor Cr3 is reversed, and the electric charge of the capacitor Ch1 moves to the capacitor Cr3.

Next, when a clock S4, a clock S4, 7 and the clock S1, 4 are in a high level state, a switch S4, a switch S4, 7 and the switch S1, 4 shown in FIG. 12 are turned on. When these switches are turned on, the electric charge accumulated in the capacitor Cr1 moves to the capacitor Ch2. More specifically, after three clocks from when the electric charge of the capacitor Ch1 is accumulated in the capacitor Cr1, the electric charge of the capacitor Cr1 moves to the capacitor Ch2. Further, the pole of the capacitor Cr4 that is connected to the GND is reversed. Then, the electric charge accumulated in the capacitor Ch1 moves to the capacitor Cx and the capacitor Cr4 whose pole has been reversed. More specifically, after one clock from when the electric charge of the capacitor Cr4 moves to the capacitor Ch2, the pole of the capacitor Cr4 is reversed, and the electric charge of the capacitor Ch1 moves to the capacitor Cr4.

Next, when a clock S5, the clock S2, 5 and a clock S5, 8 are in a high level state, a switch S5, the switch S2, 5 and a switch S5, 8 shown in FIG. 12 are turned on. When these switches are turned on, the electric charge accumulated in the capacitor Cr2 moves to the capacitor Ch2. More specifically, after three clocks from when the electric charge of the capacitor Ch1 is accumulated in the capacitor Cr2, the electric charge of the capacitor Cr2 moves to the capacitor Ch2. Further, the pole of the capacitor Cr1 that is connected to the GND is reversed. Then, the electric charge accumulated in the capacitor Ch1 moves to the capacitor Cx and the capacitor Cr1 whose pole has been reversed. More specifically, after one clock from when the electric charge of the capacitor Cr1 moves to the capacitor Ch2, the pole of the capacitor Cr1 is reversed, and the electric charge of the capacitor Ch1 moves to the capacitor Cr1.

Next, when the clock S6, the clock S3, 6 and the clock S6, 1 are in a high level state, the switch S6, the switch S3, 6 and the switch S6, 1 shown in FIG. 12 are turned on. When these switches are turned on, the electric charge accumulated in the capacitor Cr3 moves to the capacitor Ch2. More specifically, after three clocks from when the electric charge of the capacitor Ch1 is accumulated in the capacitor Cr3, the electric charge of the capacitor Cr3 moves to the capacitor Ch2. Further, the pole of the capacitor Cr2 that is connected to the GND is reversed. Then, the electric charge accumulated in the capacitor Ch1 moves to the capacitor Cx and the capacitor Cr2 whose pole has been reversed. More specifically, after one clock from when the electric charge of the capacitor Cr2 moves to the capacitor Ch2, the pole of the capacitor Cr2 is reversed, and the electric charge of the capacitor Ch1 moves to the capacitor Cr2.

Next, when a clock S7, the clock S4, 7 and the clock S7, 2 are in a high level state, a switch S7, the switch S4, 7 and the switch S7, 2 shown in FIG. 12 are turned on. When these switches are turned on, the electric charge accumulated in the capacitor Cr4 moves to the capacitor Ch2. More specifically, after three clocks from when the electric charge of the capacitor Ch1 is accumulated in the capacitor Cr4, the electric charge of the capacitor Cr4 moves to the capacitor Ch2. Further, the pole of the capacitor Cr3 that is connected to the GND is reversed. Then, the electric charge accumulated in the capacitor Ch1 moves to the capacitor Cx and the capacitor Cr3 whose pole has been reversed. More specifically, after one clock from when the electric charge of the capacitor Cr3 moves to the capacitor Ch2, the pole of the capacitor Cr3 is reversed, and the electric charge of the capacitor Ch1 moves to the capacitor Cr3.

Next, when a clock S8, the clock S5, 8 and the clock S8, 3 are in a high level state, a switch S8, the switch S5, 8 and the switch S8, 3 shown in FIG. 12 are turned on. When these switches are turned on, the electric charge accumulated in the capacitor Cr1 moves to the capacitor Ch2. More specifically, after three clocks from when the electric charge of the capacitor Ch1 is accumulated in the capacitor Cr1, the electric charge of the capacitor Cr1 moves to the capacitor Ch2. Further, the pole of the capacitor Cr4 that is connected to the GND is reversed. Then, the electric charge accumulated in the capacitor Ch1 moves to the capacitor Cx and the capacitor Cr4 whose pole has been reversed. More specifically, after one clock from when the electric charge of the capacitor Cr4 moves to the capacitor Ch2, the pole of the capacitor Cr4 is reversed, and the electric charge of the capacitor Ch1 moves to the capacitor Cr4.

If turning on and off of the switches is repeated in accordance with changes in high and low levels of each clock in this manner, it is possible to realize the LPF 100 shown in FIG. 1. If the capacity of each capacitor and the switching timing of each switch are adjusted appropriately, and the turning on and off of each switch is switched to transfer and receive an electric charge between the capacitors, it is possible to realize the LPF having the frequency characteristics shown in FIG. 3. In addition, by controlling the timing (the delay time) of movement of the capacitors Cr1 and Cr2 from the A point side to the B point side or from the B point side to the A point side, it is possible to switch the depth of a notch in the frequency characteristics, or it is possible to inhibit the occurrence of a notch.

2-5. Modified Example of LPF According to Embodiment of the Present Invention

Figure 14:
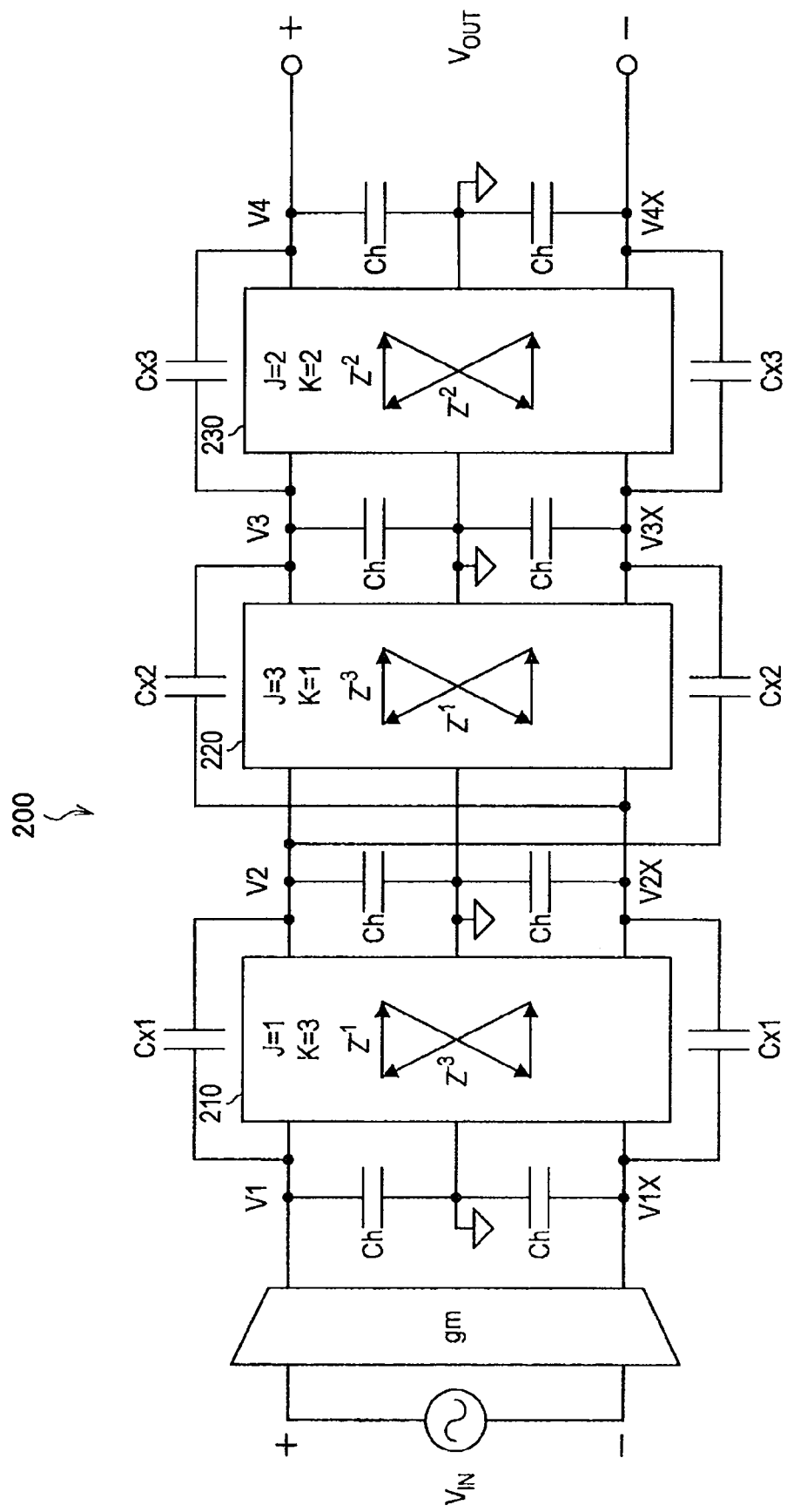
FIG. 14 is an explanatory diagram showing the structure of a LPF 200 according to a modified example of the embodiment of the present invention.

Next, a case will be described in which three charge domain IIR-LPFs are connected in a cascade arrangement, and a steep LPF is structured in which a notch appears at three locations in the frequency characteristics. FIG. 14 is an explanatory diagram showing the structure of a LPF 200 according to a modified example of the embodiment of the present invention.

The LPF 200 shown in FIG. 14 includes three flying capacitor portions that have a differential structure and that are connected in a cascade arrangement, each of the flying capacitor portions being the same as that of the LPF 100 shown in FIG. 1. A flying capacitor 210 is a flying capacitor when J=1 and K=3 are set, respectively. A flying capacitor 220 is a flying capacitor when J=3 and K=1 are set, respectively. A flying capacitor 230 is a flying capacitor when J=2 and K=2 are set, respectively. Further, both ends of the flying capacitor 210 are provided with a capacitor Cx1, both ends of the flying capacitor 220 are provided with a capacitor Cx2, and both ends of the flying capacitor 230 are provided with a capacitor Cx3.

Each of the flying capacitors 210, 220 and 230 is provided with a capacitor Cr having a capacity Cr. Further, the capacity of the capacitor Cx1 is set to M1 times the Cr, the capacity of the capacitor Cx2 is set to M2 times the Cr, and the capacity of the capacitor Cx3 is set to M3 times the Cr.

The capacitors Cx2 are provided such that they connect between a V2X point on the negative phase side and a V3 point on the positive phase side, and between a V2 point on the positive phase side and a V3X point on the negative phase side of the differential structured flying capacitor 220.

Figure 15:
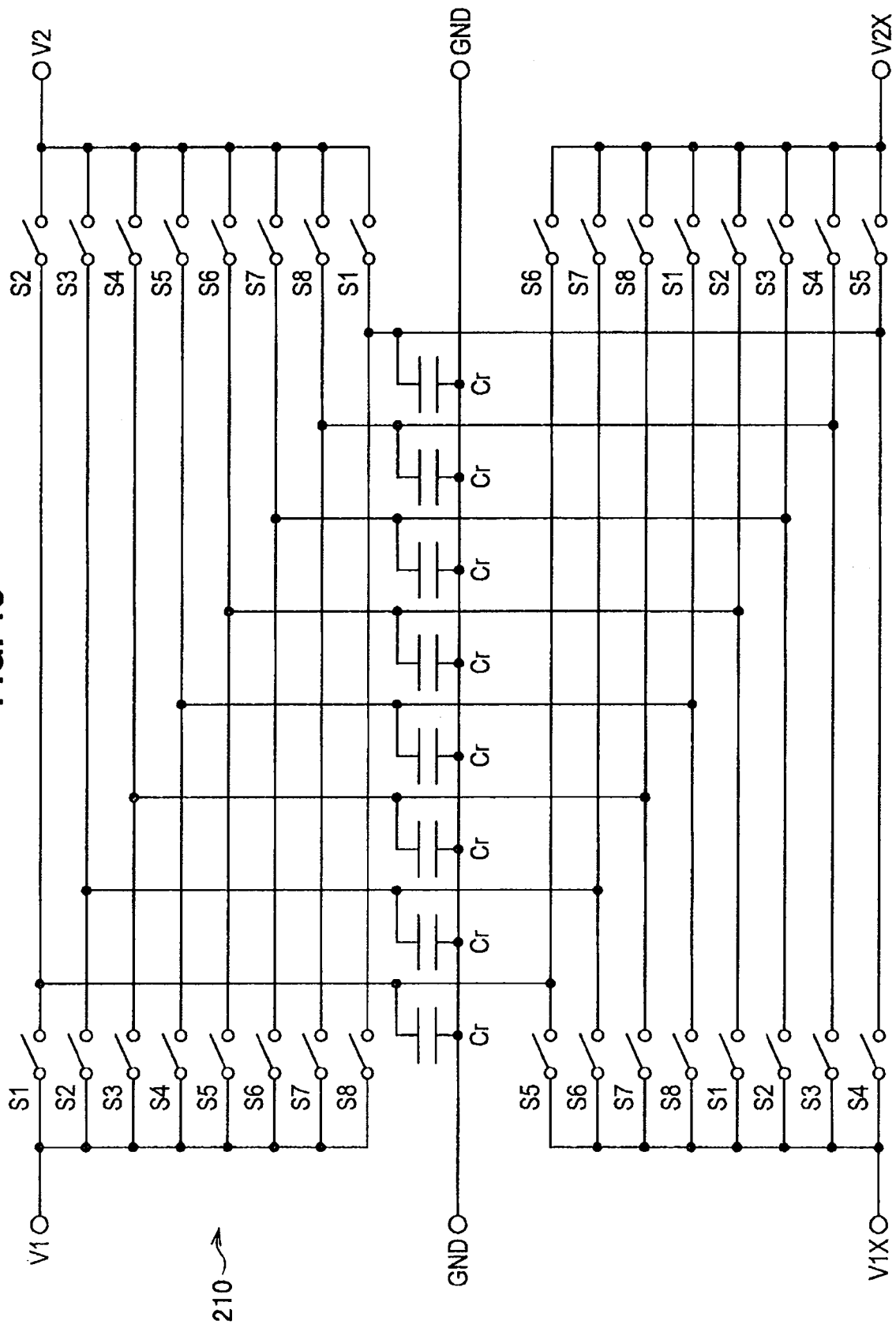
FIG. 15 is an explanatory diagram showing an example of the circuit structure of a flying capacitor.
Figure 16:
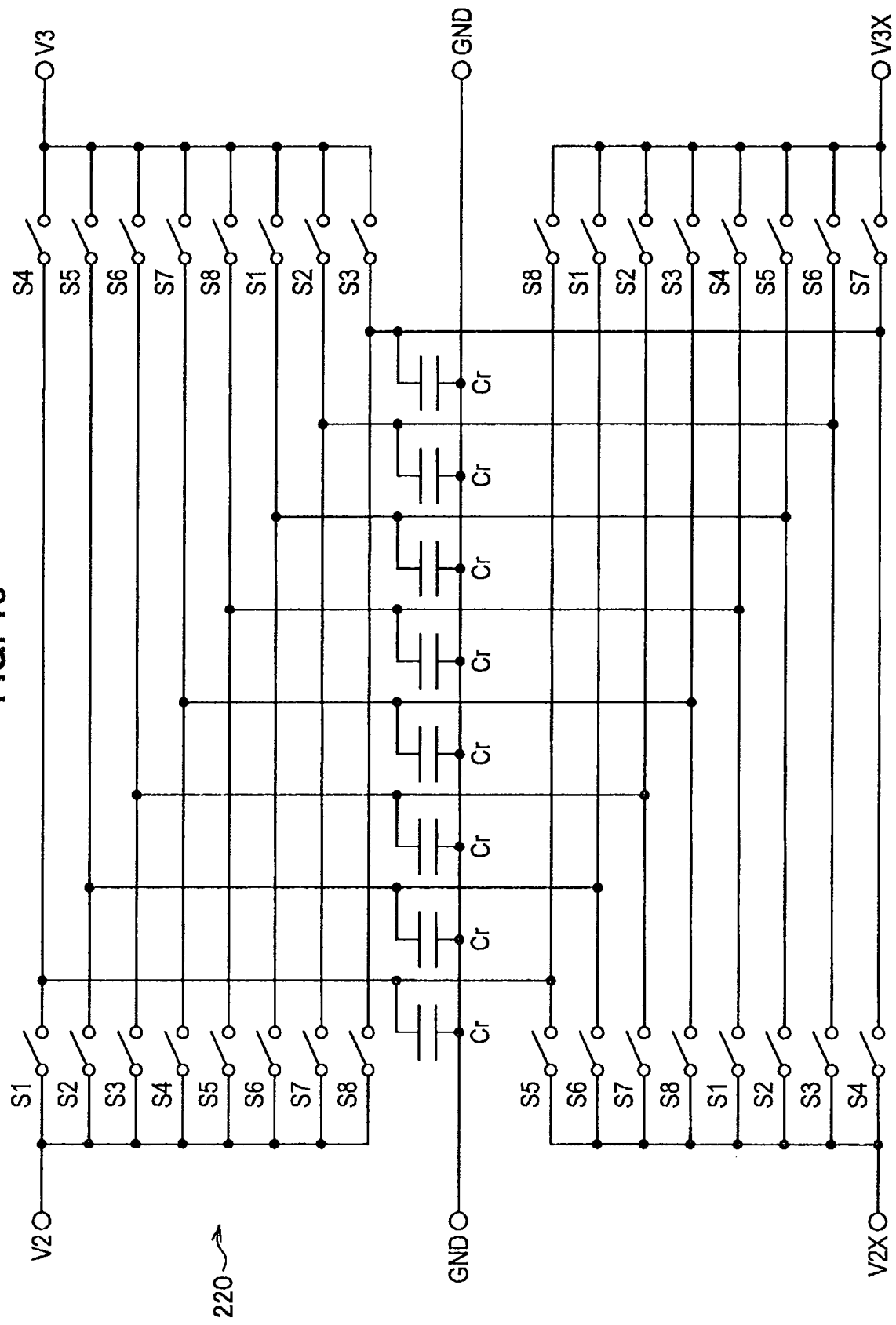
FIG. 16 is an explanatory diagram showing an example of the circuit structure of a flying capacitor.
Figure 17:
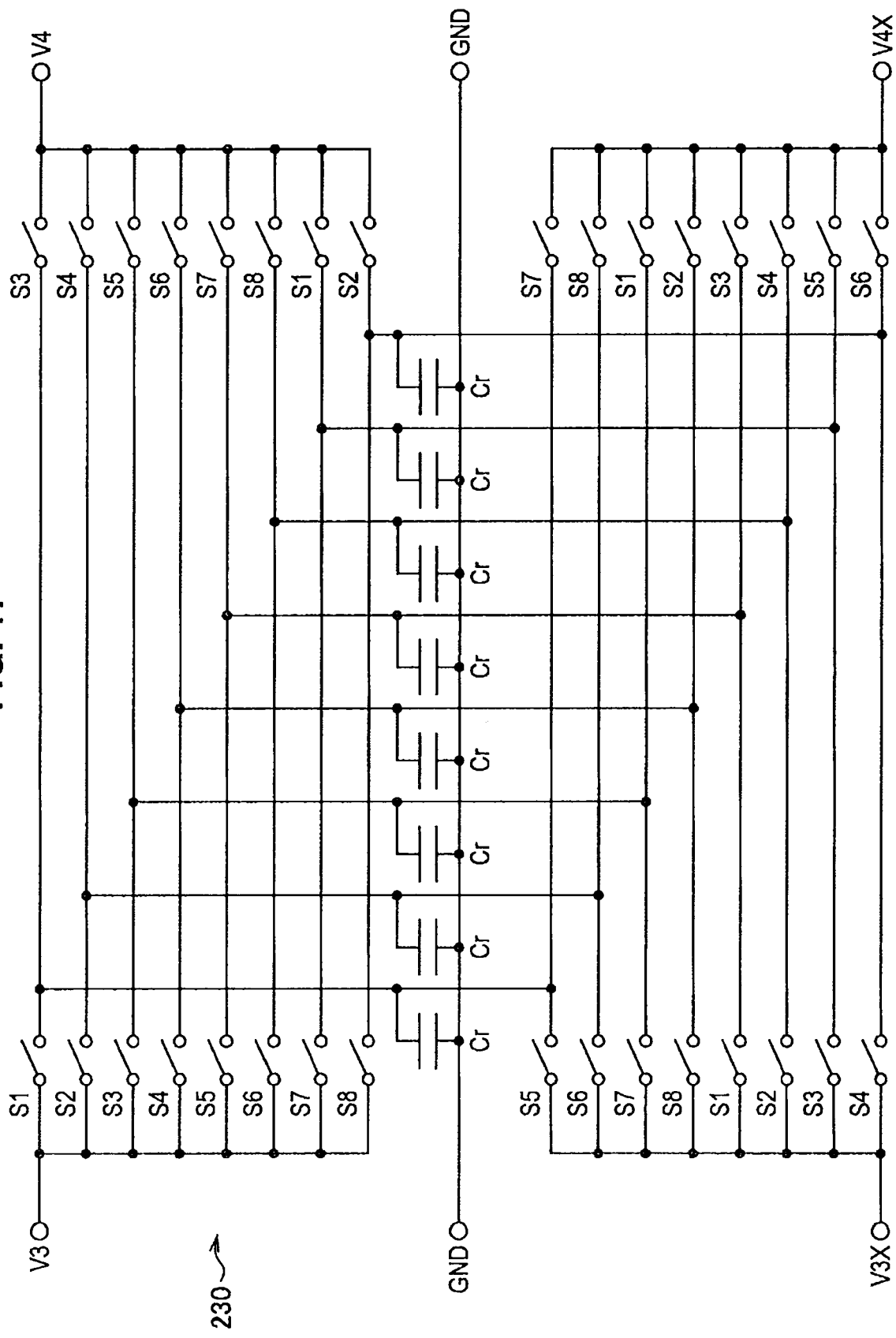
FIG. 17 is an explanatory diagram showing an example of the circuit structure of a flying capacitor.
Figure 18:
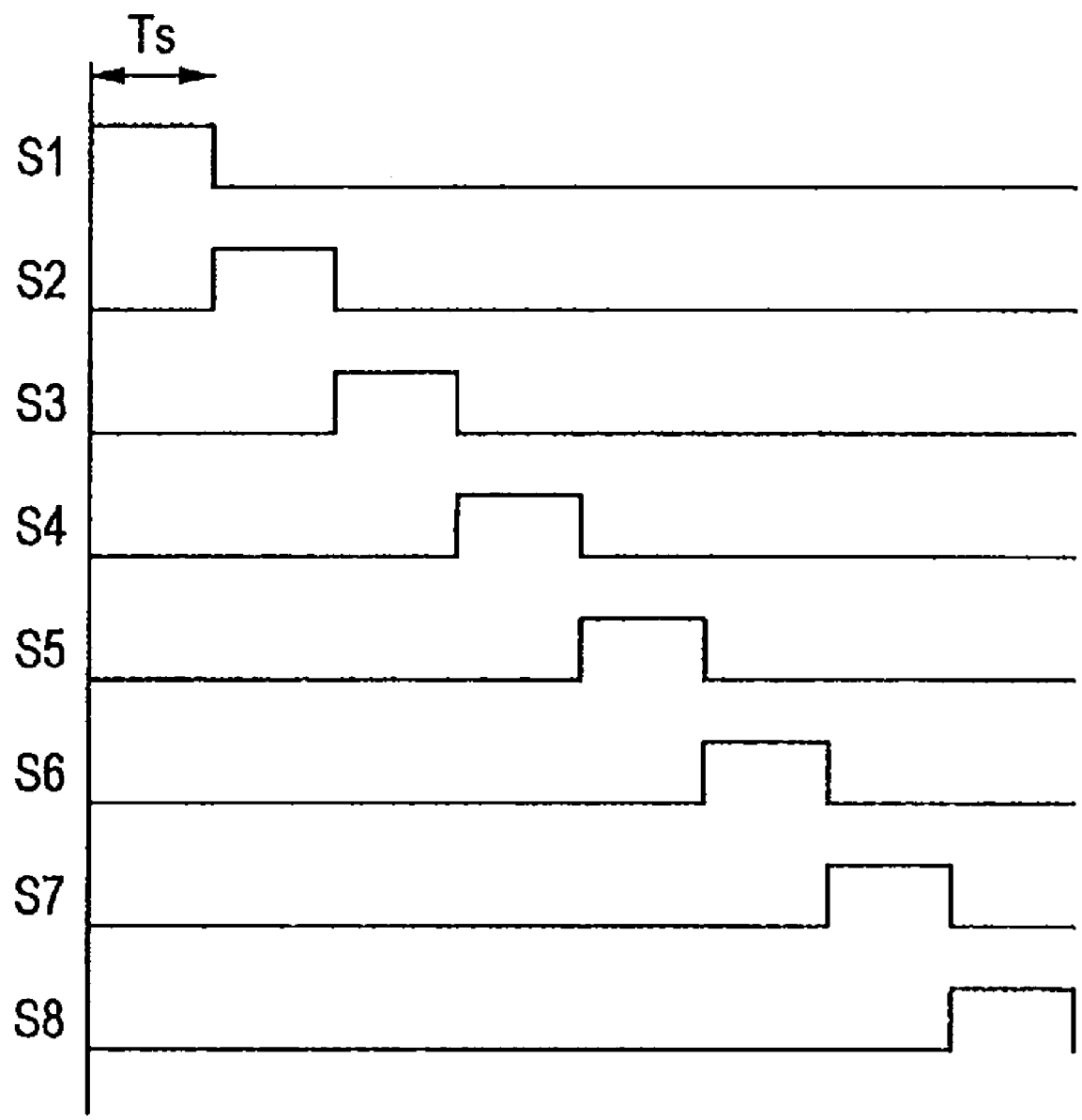
FIG. 18 is an explanatory diagram showing waveforms of clocks input to the LPF 200.

Examples of the circuit structure of the flying capacitors 210, 220 and 230 are respectively shown in FIG. 15, FIG. 16 and FIG. 17. Waveforms of clocks input to the LPF 200 are shown in FIG. 18. Each of the clocks shown in FIG. 18 corresponds to each of the switches of the flying capacitors 210, 220 and 230 shown in FIG. 15, FIG. 16 and FIG. 17. Each of the switches shown in FIG. 15, FIG. 16 and FIG. 17 is turned on when each of the clocks shown in FIG. 18 is in a high level state, and is turned off when each of the clocks shown in FIG. 18 is in a low level state.

An operation of the flying capacitor 210 will be described. When a clock S1 changes to a high level state, a switch S1 is turned on, and an electric charge is transferred from a capacitor Ch on the input side to the capacitor Cr that is connected to a V1 point and a V1A point by the switch S1. The electric charge accumulated in the capacitor Cr that is connected to the V2 point and a V2A point by the switch S1 is transferred to a capacitor Ch on the output side. When the clock S1 changes to a low level state and a clock S2 changes to a high level state, a switch S2 is turned on, and an electric charge is transferred to the capacitor Ch on the output side from the capacitor Cr in which the electric charge is accumulated while the clock S1 is in a high level state. Therefore after one clock from when the electric charge of the capacitor Ch on the input side is accumulated in the capacitor Cr, the electric charge of the capacitor Cr moves to the capacitor Ch on the output side.

If a clock S5 changes to a high level state after three clock cycles from when the clock S2 changes to the high level state, the capacitor Cr connected to the V1 point by the switch S1 is connected to a V1X point on the negative phase side. In a similar manner, the capacitor Cr connected to the V1X point by the switch S1 is connected to the V1 point on the negative phase side. Accordingly, after three clocks from when the electric charge moves to the capacitor Ch on the output side, the capacitor Cr is connected to the capacitor Ch on the input side in a state where the polarity of the capacitor Cr is reversed.

Regarding the other capacitors Cr, an electric charge is transferred and received and their polarities are reversed, based on switching operations of the switches in response to the switching of high and low level states of the clocks.

Note that, here, the flying capacitor 210 is used as an example. However, the switching operations of the flying capacitors 220 and 230 are performed in a similar manner, and an electric charge is transferred between the input side and the output side while the polarity of the capacitor Cr is switched. With the flying capacitor 220, after three clocks from when the electric charge of the capacitor Ch on the input side is accumulated in the capacitor Cr, the electric charge of the capacitor Cr moves to the capacitor Ch on the output side. Then, after one clock from when the electric charge moves to the capacitor Ch on the output side, the capacitor Cr is connected to the capacitor Ch on the input side in a state where the polarity of the capacitor Cr is reversed. In a similar manner, with the flying capacitor 230, after two clocks from when the electric charge of the capacitor Ch on the input side is accumulated in the capacitor Cr, the electric charge of the capacitor Cr moves to the capacitor Ch on the output side. Then, after two clocks from when the electric charge moves to the capacitor Ch on the output side, the capacitor Cr is connected to the capacitor Ch on the input side in a state where the polarity of the capacitor Cr is reversed.

Parameters of the flying capacitor 210 are respectively set such that J=1, K=3 and M1=0.5. If the parameters of the flying capacitor 210 are set in this manner, it is possible to produce a notch at a frequency that is ½ of the sampling frequency in the frequency characteristics of the LPF 200. Further, parameters of the flying capacitor 220 are respectively set such that J=3, K=1 and M2=−0.618. If the parameters of the flying capacitor 220 are set in this manner, it is possible to produce a notch at a frequency that is 3/10 of the sampling frequency in the frequency characteristics of the LPF 200. Furthermore, parameters of the flying capacitor 230 are respectively set such that J=2, K=2 and M2=1.0. If the parameters of the flying capacitor 230 are set in this manner, it is possible to produce a notch at a frequency that is ⅙ of the sampling frequency in the frequency characteristics of the LPF 200.

Figure 19:
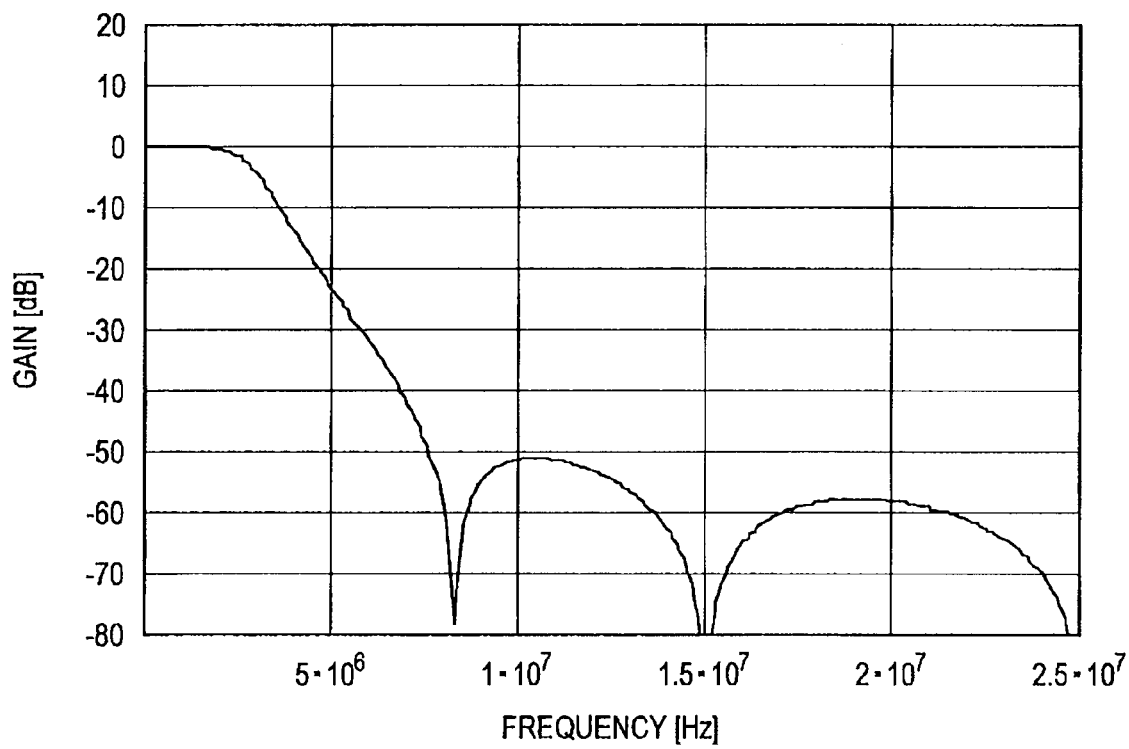
FIG. 19 is an explanatory diagram showing frequency characteristics of the LPF 200 shown in FIG. 14.
Figure 20:
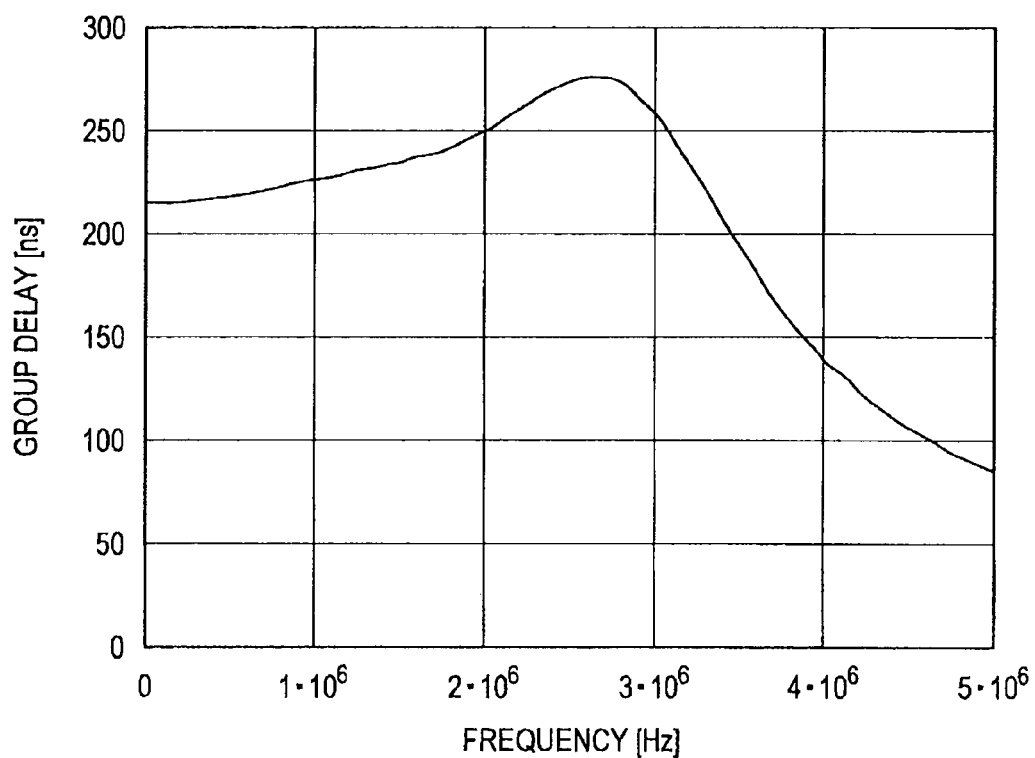
FIG. 20 is an explanatory diagram showing group delay characteristics of the LPF 200 shown in FIG. 14.

FIG. 19 and FIG. 20 respectively show frequency characteristics and group delay characteristics of the LPF 200 that is shown in FIG. 14. Note that it is assumed that the sampling frequency=50 [MHz], Ts=20 [ns], Gm=1 [mS], Cr=2 [pF], Ch=7 [pF], Cx1=1.0 [pF], Cx2=1.236 [pF] and Cx3=2.0 [pF]. As shown in FIG. 19, the LPF 200 shown in FIG. 14 has frequency characteristics in which a notch occurs at a frequency that is ⅙ of the sampling frequency, at a frequency that is 3/10 of the sampling frequency, and at a frequency that is ½ of the sampling frequency.

According to the group delay characteristics of the LPF 200 shown in FIG. 20, the variation of the group delay time within the frequency pass band (approximately 2 [MHz] or less) is about 40 [ns], and the group delay characteristics are relatively flat within the frequency pass band.

If a plurality of charge domain IIR-LPFs whose parameters are changed in this manner are connected in a cascade arrangement, it is possible to realize a LPF which has frequency characteristics in which a notch is produced at a plurality of frequencies, and which also has relatively good group delay characteristics.

3. COMMUNICATION DEVICE PROVIDED WITH LPF ACCORDING TO EMBODIMENT OF THE PRESENT INVENTION

Figure 21:
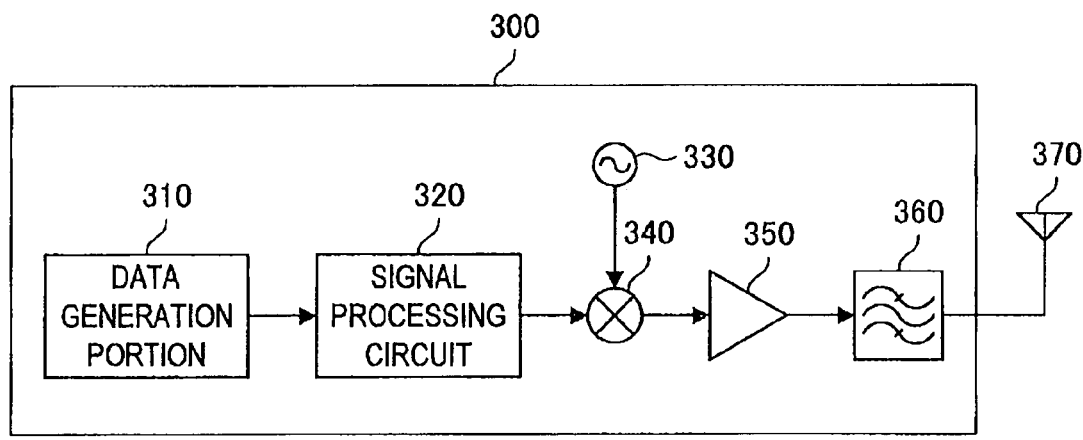
FIG. 21 is an explanatory diagram showing the structure of a communication device provided with the LPF according to the embodiment of the present invention.

Next, the structure of a communication device provided with the LPF according to the embodiment of the present invention will be described. FIG. 21 is an explanatory diagram showing the structure of a communication device 300 provided with the LPF according to the embodiment of the present invention.

As shown in FIG. 21, the communication device 300 provided with the LPF according to the embodiment of the present invention includes a data generation portion 310, a signal processing circuit 320, a frequency converter 340, a local signal generator 330, a power amplifier 350, a band limiting filter 360 and an antenna 370.

Data to be transmitted from the communication device 300 is generated in the data generation portion 310 and is input to the signal processing circuit 320. In the signal processing circuit 320, processing such as D/A conversion, encoding and modulation is performed. Thus, a transmission signal in a base band or in an intermediate frequency (IF) band is generated. The transmission signal from the signal processing circuit 320 is input to the frequency converter (mixer) 340, and is multiplied by a local signal from the local signal generator 330. As a result of multiplication of the transmission signal by the local signal, the transmission signal is converted to a radio frequency (RF) band signal, namely, up-converted.

The RF signal that is obtained by up-conversion in the frequency converter 340 is amplified by the power amplifier 350, and is then input to the band limiting filter 360. After the RF signal is subjected to band limitation by the band limiting filter 360 and unnecessary frequency components are thereby removed, the resultant RF signal is supplied to the antenna 370. Note that various types of charge domain second order IIR-LPF circuits described above can be used as the band limiting filter 360.

4. CONCLUSION

As described above, according to the embodiment of the present invention, the capacitors Cx are provided so as to sandwich a flying capacitor, and delay is provided for movement of the two capacitors Cr1 and Cr2 in the flying capacitor. As a result of structuring a LPF in this manner, it is possible to realize the LPF having frequency characteristics in which a notch occurs. In this case, by setting parameters relating to the delay time and the capacity of the capacitor Cx, it is possible to produce a notch at a determined frequency. Thus, the LPF with steep attenuation characteristics can be obtained. Further, if the delay time when the capacitors Cr1 and Cr2 move from the input side to the output side is varied, occurrence and non-occurrence of a notch can be switched. Moreover, in a state where the sum of the delay time when the capacitors Cr1 and Cr2 move from the input side to the output side and the delay time when the capacitors Cr1 and Cr2 move from the output side to the input side is constant, the delay time when they move from the input side to the output side is varied. If the delay time when the capacitors Cr1 and Cr2 move from the input side to the output side is varied in this manner, the occurrence and non-occurrence of the notch can be switched while the frequency characteristics within the pass band are kept the same. Further, if the delay time when the capacitors Cr1 and Cr2 move from the input side to the output side is varied while the delay time when they move from the output side to the input side is kept constant, the occurrence and non-occurrence of the notch can be switched while the cut off frequency is kept the same.

Moreover, if the flying capacitor has a differential structure, a plurality of notches can be produced in filter frequency characteristics. In addition, if a plurality of flying capacitors are connected in a cascade arrangement, a plurality of notches can be produced in the filter frequency characteristics and steep attenuation characteristics can be obtained.

It should be understood by those skilled in the art that various modifications, combinations, sub-combinations and alterations may occur depending on design requirements and other factors insofar as they are within the scope of the appended claims or the equivalents thereof.

The present application contains subject matter related to that disclosed in Japanese Priority Patent Application JP 2008-324666 filed in the Japan Patent Office on Dec. 19, 2008, the entire content of which is hereby incorporated by reference.

What is claimed is:

1. A filter circuit, comprising:
a flying capacitor coupled to receive an input signal at an input terminal to generate a filtered signal at an output terminal, wherein the flying capacitor maintains polarity when switching from the input terminal to the output terminal, the polarity of which is reversed when switching from the output terminal to the input terminal, and the flying capacitor switches based on clock signals provided for clock inputs on the flying capacitor; and
a capacitor that is connected between the input terminal and the output terminal of the flying capacitor to provide steep attenuation characteristics of the filter circuit after cut-off frequency, wherein
the flying capacitor is switched from the input terminal to the output terminal with a delay of J clocks, J being a natural number equal to or greater than 1, of a clock cycle input to the flying capacitor after the switching from the output terminal to the input terminal, and
the flying capacitor is switched from the output terminal to the input terminal with a delay of K clocks, K being a natural number of equal to or greater than 1 and not equal to J, of the clock cycle after the switching from the input terminal to the output terminal.

2. The filter circuit according to claim 1, wherein a value of J is variable.

3. The filter circuit according to claim 1, wherein a value of J is variable, and a sum of J and K is constant.

4. The filter circuit according to claim 1, wherein a value of J is variable, and a value of K is constant.

5. The filter circuit according to claim 1, wherein a plurality of groups of the flying capacitor and the capacitor are connected in a cascade arrangement.

6. The filter circuit according to claim 1, wherein a capacity of the capacitor is M times a capacity of a capacitor included in the flying capacitor, M being a value when M that is equal to $\exp(-j*2\pi f*Ts*J)/(\exp(-j*2\pi f*Ts)-1)$ is a real number, where Ts is the clock cycle, and f is a frequency at which a notch occurs.

7. The filter circuit according to claim 6, wherein when the value of M is negative, the flying capacitor has a differential structure, and the capacitor is provided between the input terminal on a positive phase side and an output terminal on a negative phase side of the flying capacitor, and between the output terminal on the positive phase side and an input terminal on the negative phase side of the flying capacitor.

8. The filter circuit according to claim 1, wherein a capacity of the capacitor is M times a capacity of a capacitor included in the flying capacitor, M being a value when M that is equal to $\exp(-j*2\pi f*Ts*J)/(\exp(-j*2\pi f*Ts)-1)$ is an imaginary number, where Ts is the clock cycle, and f is a frequency at which a notch occurs.

9. The filter circuit according to claim 8, wherein the filter circuit includes two units of the flying capacitor having a differential structure, and one of the flying capacitor is supplied with a voltage that is expressed by a complex voltage.

10. A communication device, comprising:
the filter circuit according to claim 1.

11. The filter circuit according to claim 1, wherein
the filter circuit is a low-pass filter circuit, and
the flying capacitor is coupled to receive the input signal at the input terminal to generate a low-pass filtered signal at the output terminal.

* * * * *